United States Patent
Hida et al.

(10) Patent No.: US 8,793,555 B2
(45) Date of Patent: Jul. 29, 2014

(54) METHOD OF CONTROLLING A SEMICONDUCTOR STORAGE DEVICE

(71) Applicant: Kabushiki Kaisha Toshiba, Minato-ku (JP)

(72) Inventors: Toshikatsu Hida, Kanagawa (JP); Shinichi Kanno, Tokyo (JP); Hirokuni Yano, Tokyo (JP); Kazuya Kitsunai, Kanagawa (JP); Shigehiro Asano, Kanagawa (JP); Junji Yano, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/049,742

(22) Filed: Oct. 9, 2013

(65) Prior Publication Data

US 2014/0040664 A1    Feb. 6, 2014

Related U.S. Application Data

(63) Continuation of application No. 13/486,718, filed on Jun. 1, 2012, now Pat. No. 8,583,972, which is a continuation of application No. 13/270,788, filed on Oct. 11, 2011, now Pat. No. 8,219,861, which is a continuation of application No. 12/529,282, filed as application No. PCT/JP2008/067597 on Sep. 22, 2008, now Pat. No. 8,060,797.

(30) Foreign Application Priority Data

Feb. 29, 2008   (JP) ................................. 2008-049193

(51) Int. Cl.
*G11C 29/00*   (2006.01)

(52) U.S. Cl.
USPC .......... 714/764; 714/723; 714/710; 714/47.1; 714/25; 714/718; 711/136; 711/160; 711/159; 365/201; 365/185.09

(58) Field of Classification Search
None
See application file for complete search history.

(56) References Cited

U.S. PATENT DOCUMENTS 5,475,693 A * 12/1995 Christopherson et al. .... 714/710
5,732,092 A *  3/1998 Shinohara ..................... 714/764

(Continued)

FOREIGN PATENT DOCUMENTS

JP   8 279295    10/1996
JP   2003 58432   2/2003

(Continued)

OTHER PUBLICATIONS

European Search Report issued Mar. 11, 2011 in European Patent Application No. EP 08 872498.

(Continued)

*Primary Examiner* — John Trimmings
(74) *Attorney, Agent, or Firm* — Oblon, Spivak, McClelland, Maier & Neustadt, L.L.P.

(57) ABSTRACT

A method of controlling a nonvolatile semiconductor memory includes checking, at a first interval period, an error count of data stored in a first group, the first group including a plurality of blocks/units, and when a first block/unit in the first group satisfies a first condition, assigning the first block/unit to a second group. The method includes checking, at a second interval period, an error count of data stored in the second group, the second interval period being shorter than the first interval period, and when a second block/unit in the second group satisfies a second condition, moving data stored in the second block/unit to an erased block/unit in which stored data is erased among the plurality of blocks/units.

17 Claims, 21 Drawing Sheets

(56) References Cited

U.S. PATENT DOCUMENTS

| | | | |
|---|---|---|---|
| 5,963,473 A | 10/1999 | Norman | |
| 6,151,246 A | 11/2000 | So et al. | |
| 6,260,156 B1* | 7/2001 | Garvin et al. | 714/6.13 |
| 6,381,176 B1* | 4/2002 | Kim et al. | 365/185.11 |
| 6,728,913 B1* | 4/2004 | Parker | 714/723 |
| 7,295,479 B2* | 11/2007 | Yoon et al. | 365/200 |
| 7,496,811 B2* | 2/2009 | Kanno | 714/723 |
| 7,509,526 B2* | 3/2009 | Hodder | 714/6.13 |
| 7,590,010 B2* | 9/2009 | Park et al. | 365/189.05 |
| 8,046,645 B2 | 10/2011 | Hsu et al. | |
| 8,411,519 B2* | 4/2013 | Byom et al. | 365/200 |
| 2003/0007402 A1 | 1/2003 | Chevallier | |
| 2003/0033567 A1 | 2/2003 | Tamura et al. | |
| 2003/0206460 A1 | 11/2003 | Katayama et al. | |
| 2004/0153902 A1 | 8/2004 | Machado et al. | |
| 2005/0248999 A1 | 11/2005 | Tamura et al. | |
| 2007/0130496 A1 | 6/2007 | Kanno | |
| 2008/0205145 A1 | 8/2008 | Kanno et al. | |
| 2009/0177944 A1 | 7/2009 | Kanno | |
| 2009/0183052 A1 | 7/2009 | Kanno | |
| 2012/0030529 A1* | 2/2012 | Roohparvar et al. | 714/704 |

FOREIGN PATENT DOCUMENTS

| | | |
|---|---|---|
| JP | 2004 326867 | 11/2004 |
| JP | 2007 58966 | 3/2007 |
| JP | 2008 90778 | 4/2008 |
| WO | 97 32253 | 9/1997 |
| WO | WO 98/08166 | 2/1998 |

OTHER PUBLICATIONS

Taiwanese Office Action with English translation issued on Nov. 12, 2012 in corresponding patent application No. 097144965.

* cited by examiner

| ENTRY NUMBER | BLOCK NUMBER |
|---|---|
| 0 | BLOCK C |
| 1 | BLOCK A |
| 2 | BLOCK X |
| 3 | BLOCK B |
| ⋮ | ⋮ |

31

| BLOCK NUMBER | READ-OUT AMOUNT |
|---|---|
| 0 | READ-OUT AMOUNT FROM BLOCK 0 |
| 1 | READ-OUT AMOUNT FROM BLOCK 1 |
| 2 | READ-OUT AMOUNT FROM BLOCK 2 |
| 3 | READ-OUT AMOUNT FROM BLOCK 3 |
| ⋮ | ⋮ |

_32_

| BLOCK NUMBER | WRITING TIME |
|---|---|
| 0 | WRITING TIME OF BLOCK 0 |
| 1 | WRITING TIME OF BLOCK 1 |
| 2 | WRITING TIME OF BLOCK 2 |
| 3 | WRITING TIME OF BLOCK 3 |
| ⋮ | ⋮ |

| WRITING SEQUENCE NUMBER | BLOCK NUMBER |
|---|---|
| 0 | 0TH BLOCK NUMBER |
| 1 | 1ST BLOCK NUMBER |
| 2 | 2ND BLOCK NUMBER |
| 3 | 3RD BLOCK NUMBER |
| ⋮ | ⋮ |

| REGISTRATION SEQUENCE NUMBER | BLOCK NUMBER |
|---|---|
| 0 | 0TH BLOCK NUMBER |
| 1 | 1ST BLOCK NUMBER |
| 2 | 2ND BLOCK NUMBER |
| 3 | 3RD BLOCK NUMBER |
| ⋮ | ⋮ |

OLD ↑

↓ NEW

| ENTRY NUMBER | BLOCK NUMBER |
|---|---|
| 0 | BLOCK C |
| 1 | BLOCK A |
| 2 | BLOCK X |
| 3 | BLOCK B |
| ⋮ | ⋮ |

| ENTRY NUMBER | BLOCK REGISTERED TO SECOND TABLE | ERROR COUNT |
|---|---|---|
| 0 | BLOCK C | 4 |
| 1 | BLOCK A | 1 |
| 2 | BLOCK X | 1 |
| 3 | BLOCK B | 2 |
| ⋮ | ⋮ | ⋮ |

METHOD OF CONTROLLING A SEMICONDUCTOR STORAGE DEVICE

CROSS REFERENCE TO RELATED APPLICATIONS

This application is a continuation of U.S. application Ser. No. 13/486,718, filed Jun. 1, 2012, which is incorporated herein by reference. U.S. application Ser. No. 13/486,718 is a continuation of U.S. application Ser. No. 13/270,788, filed Oct. 11, 2011, which is incorporated herein by reference. U.S. application Ser. No. 13/270,788 is a continuation of U.S. application Ser. No. 12/529,282, filed Nov. 9, 2009, which is incorporated herein by reference, and which is the National Stage of PCT/JP08/067,597, filed Sep. 22, 2008, and claims priority to Japanese Patent Application 2008-049193, filed Feb. 29, 2008.

TECHNICAL FIELD

The present invention relates to a semiconductor storage device. In particular, the present invention relates to a semiconductor storage device that includes, for example, an NAND flash memory.

BACKGROUND ART

An NAND flash memory is a non-volatile memory that can retain information even when power supply is stopped. The NAND flash memory is widely popular because it has better per-bit cost than other types of non-volatile memory. However, with increasing capacity and higher integration, influence of aged deterioration in written data and read-disturb have been becoming actualized in the NAND flash memory. There is increased risk of retained data becoming degraded and the stored data not being properly reproduced. The read-disturb refers to data corruption accompanying a reading process.

The aged deterioration is a phenomenon in which a floating gate that accumulates electric charge gradually loses electric charge with time progress, thereby causing data error. The read-disturb is a phenomenon in which an error occurs in stored data, because a minute amount of electric charge is accumulated in a floating gate of the memory cell adjacent to a memory cell from which data is read out.

Problems regarding the aged deterioration and the read-disturb can be solved by correct data being restored through use of an error correcting code that corrects data errors having occurred. However, because data in the NAND flash memory remains erroneous, the correct data cannot be restored when an error exceeding a correction capability of the error correcting code occurs as the aged deterioration and the read-disturb further proceed.

Complete destruction of data stored in the NAND flash memory can be prevented and data retaining period can be extended by a refresh operation in which rewriting data in the NAND flash memory is performed after stored data is read out and error correction is performed.

As a method of extending the data retaining period for data stored in the NAND flash memory by a refresh operation as mentioned above, for example, a method can be considered in which a number of times data is read out from the NAND flash memory and the like is counted. Then a refresh operation is performed when the number of times of readout reaches a specified number. Alternatively, a method can be considered in which a refresh operation is performed when an error count (the number of errors) increases (refer to, for example, Patent Document 1).

However, in the NAND flush memory, errors are less likely to occur in data in a memory cell in which the number of rewriting is smaller. The errors in data do not uniformly increase with an elapse of a certain, fixed amount of time. Similarly, in the NAND flash memory, errors in data do not always increase when data is read out more than a specified number of times. Therefore, when a refresh operation is uniformly performed based on the number of times data is read out, rather than based on reflection on an actual data corruption state, although data corruption becomes less likely to occur, the refresh operation is needlessly performed.

Furthermore, because the NAND flash memory is a device such that the number of rewriting is limited, life of the NAND flash memory is shortened by the refresh operation being needlessly performed.

On the other hand, when the refresh operation is performed through monitoring of the data corruption state, for example, a memory cell read-out operation itself that is performed to monitor the data corruption state requires an error correcting process to be performed. As a result, an amount of calculation performed and power consumption increase.

[Patent Document 1] Japanese Patent Application Laid-open No. 2004-326867

The present invention provides a semiconductor storage device that can efficiently perform a refresh operation.

DISCLOSURE OF INVENTION

A semiconductor storage device comprising:
a non-volatile semiconductor memory storing data in blocks, the block being a unit of data erasing; and
a controlling unit monitoring an error count of data stored in a monitored block selected from the blocks and refreshing data in the monitored block in which the error count is equal to or larger than a threshold value.

BRIEF DESCRIPTION OF DRAWINGS

FIG. 12 is a diagram explaining a configuration of a fourth management table in the semiconductor storage device according to the first embodiment;

FIG. 14 is a diagram explaining a configuration of a fifth management table in the semiconductor storage device according to the first embodiment;

FIG. 16 is a diagram explaining a configuration of a sixth management table in the semiconductor storage device according to the first embodiment;

FIG. 18 is a diagram explaining a configuration of a seventh management table in the semiconductor storage device according to the first embodiment;

BEST MODE(S) FOR CARRYING OUT THE INVENTION

Exemplary embodiments of a semiconductor storage device according to the present invention are explained in detail in the following with reference to the drawings. The present invention is not limited to the following embodiments as they are, and constituent elements can be variously modified and put into practice within the scope of the invention during an implementation stage.

[First Embodiment]

Figure 1:
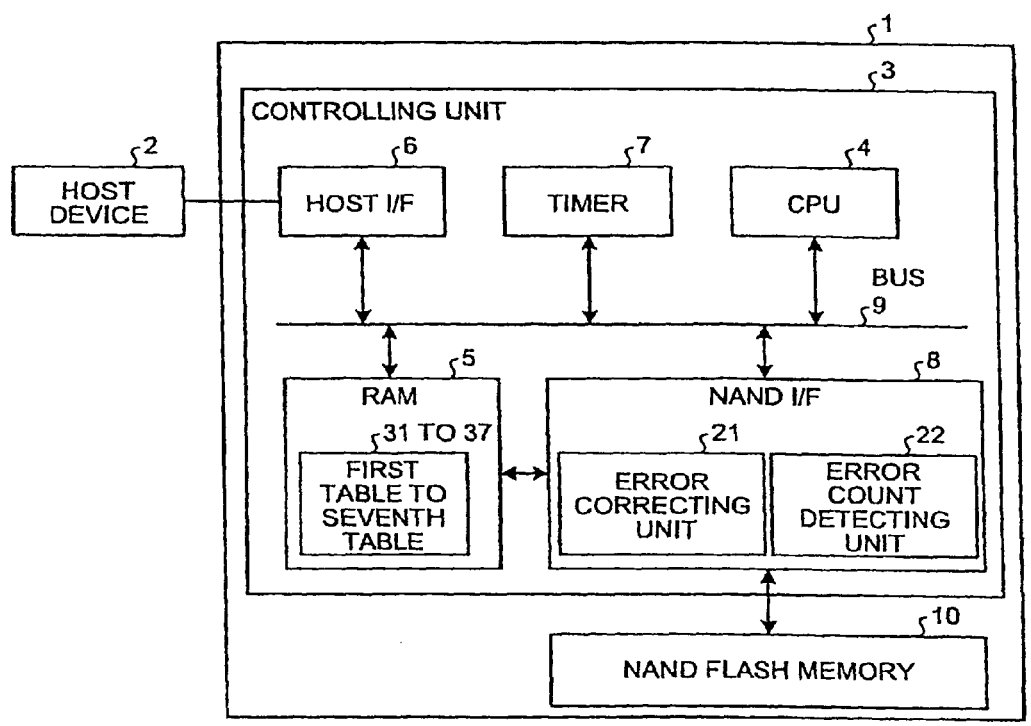
FIG. 1 is a block diagram of an overall configuration of a semiconductor storage device according to a first embodiment of the present invention.

FIG. 1 is a block diagram of an overall configuration of a semiconductor storage device 1 according to a first embodiment. The semiconductor storage device 1 shown in FIG. 1 is an embodiment of the present invention. The present invention is not limited to the configuration.

The semiconductor storage device 1 according to the first embodiment includes a controlling unit 3 and an NAND flash memory 10. The controlling unit 3 includes a central processing unit (CPU) 4, a random access memory (RAM) 5, a host interface (I/F) 6, a timer 7, an NAND interface (I/F) 8, and a bus 9. The CPU 4 runs programs. The RAM 5 stores therein data, programs, and the like. The host I/F 6 communicates with a host device 2 connected to the semiconductor storage device 1. The NAND I/F 8 controls data transfer performed between the controlling unit 3 and the NAND flash memory 10. The bus 9 connects the CPU 4, the RAM 5, the host I/F 6, the timer 7, and the NAND I/F 8 in a manner allowing communication.

The NAND flash memory 10 is configured by arraying a plurality of blocks. A block is a unit by which data is erased. A block includes a plurality of pages. A page is a unit by which data is written and read.

The semiconductor storage device 1 communicates with the host device 2, via the host I/F 6, thereby performing data transfer between the host device 2 and the semiconductor storage device 1 in response to a request from the host device 2. Interpretation of the request from the host device 2 and control of the semiconductor storage device 1 itself are realized by the CPU 4 interpreting a program stored in the RAM 5 within the controlling unit 3. Data provided by the host device 2 is stored in the NAND flash memory 10. The controlling unit 3 mediates data transfer between the host device 2 and the NAND flash memory 10.

The controlling unit 3 within the semiconductor storage device 1 communicates with the host device 2, via the host I/F 6, thereby performing data transfer between the RAM 5 within the controlling unit 3 and the host device 2. Data transferred from the host device 2 is temporarily retained in the RAM 5 within the controlling unit 3. At a specified timing, the data is written to the NAND flash memory 10, via the NAND I/F 8. When the host device 2 makes a readout request, in the controlling unit 3, the data is read from the NAND flash memory 10 in response to an instruction from the CPU 4, and the read data is stored in the RAM 5 within the controlling unit 3. The controlling unit 3 then transfers the data stored in the RAM 5 to the host device 2, via the host I/F 6.

The NAND I/F 8 used when the data is written to and read from the NAND flash memory 10 includes an error correcting unit 21 and an error count detecting unit 22. The error correcting unit 21 and the error count detecting unit 22 serve as an error correcting circuit. The error correcting unit 21 provides a function for correcting an error in data read out from an arbitrary block within the NAND flash memory 10. The error count detecting unit 22 provides a function for detecting an error count of errors corrected by the error correcting unit 21. A correction capability of an error correcting code attached by the error correcting unit 21 is two bits or more. Here, the present embodiment is described under a premise that the correction capability is eight bits. However, the present invention is not limited to this error correction capability.

When the data in the RAM 5 is written to the NAND flash memory 10, the error correcting unit 21 calculates the error correcting code of the data to be written in, and writes the error correcting code in the NAND flash memory 10 with the data. When the data is read out from the NAND flash memory 10, the error correcting unit 21 uses the data read out from the NAND flash memory 10 and the error correcting code stored with the data in the NAND flash memory 10 to correct an error in the read data. When the error is corrected, the error count detecting unit 22 detects an error count of corrected errors and stores therein the detected error count. Here, the error count of corrected errors is stored in the error count detecting unit 22. However, a location in which the error count of corrected errors is stored is not limited thereto.

When the error correcting unit 21 corrects the error, the NAND I/F 8 generates an interrupt to the CPU 4, thereby giving notification that an error has occurred in the data stored in the NAND flash memory 10. The CPU 4 then accesses the error count detecting unit 22 in the NAND I/F 8 and obtains the count of corrected errors.

The timer 7, when an arbitrary amount of time is set, then internally measures time. The timer 7 generates an interrupt to the CPU 4 when the set amount of time elapses. The CPU 4 is notified of the elapse of the set amount of time by the interrupt from the timer 7.

The NAND flash memory 10 stores therein data provided by the host device 2 and error correcting codes calculated from the data by the error correcting unit 21 in combination.

Figures 2, 3:
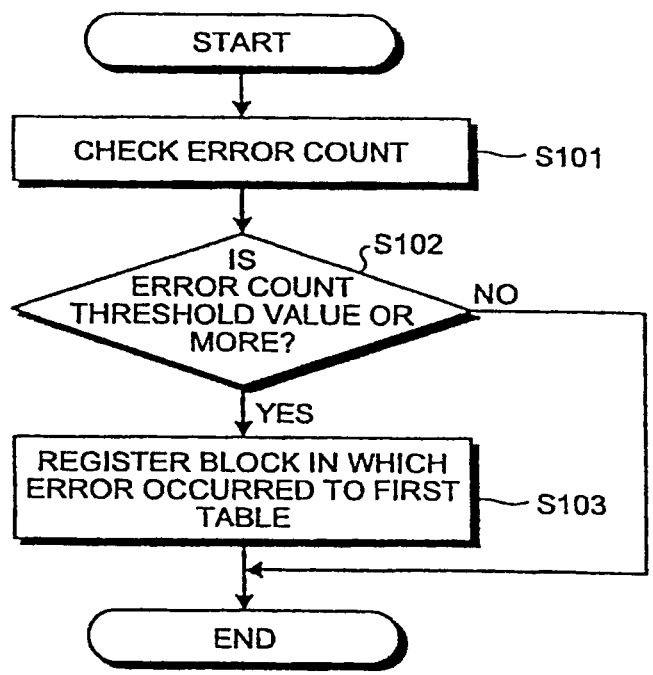
FIG. 2 is a diagram explaining a configuration of a first management table in the semiconductor storage device according to the first embodiment.
FIG. 3 is a flowchart of a monitored block selecting process performed in the semiconductor storage device according to the first embodiment.

The RAM 5 includes a first management table 31. The first management table 31 records therein information on blocks requiring a refresh operation to be performed in a near future. FIG. 2 is a diagram explaining a configuration of the first management table 31. The first management table 31 includes a plurality of entries. A block number in the NAND flash memory 10 is registered to each entry. The first management table 31 is accessed by an entry number. A block recorded in each entry is treated as a block in which an error count of storing data is to be monitored (referred to, hereinafter, as a monitored block).

The RAM 5 also may include a second management table 32, a third management table 33, a fourth management table 34, a fifth management table 35, a sixth management table 36, and a seventh management table 37. The second management table 32 to the seventh management table 37 will be described hereafter.

According to the first embodiment, when an error occurs in the data read out from the NAND flash memory 10 in response to the request from the host device 2, whether to monitor the error count of the block storing therein the data in which the error has occurred is decided through procedures shown in FIG. 3. FIG. 3 is a flowchart of a process for selecting a monitored block according to the first embodiment.

First, when the CPU 4 reads the data from a block in the NAND flash memory 10, the error correcting section 21 corrects the error in the read data. The error count detecting unit 22 detects the count of errors corrected and stores therein the detected error count. The CPU 4 accesses the error count detecting unit 22, acquires the error count of the errors that have occurred in the read data, and checks the error count (Step S101). The CPU 4 then checks whether the error count is equal to a first threshold value or more (Step S102). The first threshold value is a threshold value of the error count used to select a block to be monitored. Here, for example, the first threshold value is a two-bit.

When the error count of errors that have occurred in the data read out from the block in the NAND flash memory 10 is equal to the first threshold value or more (two bits or more) (Yes at Step S102), it is possible that the error count of the data will further increase due to influence of the aged deterioration and the read-disturb. An error exceeding the correction capability of the error correcting code may occur. Therefore, the CPU 4 selects the block in which the error has occurred (the block in which the data read out from the NAND flash memory 10 is stored) as the monitored block and registers the block to the first management table 31 (Step S103).

When the error count of the errors that have occurred in the data read out from the NAND flash memory 10 is less than the first threshold value (less than two bits) (No at Step S102), the CPU 4 completes the process without registering the block to the first management table 31.

The data stored in the block registered to the first management table 31 has a high error count. It is very likely that the error count will further increase due to the influence of the aged deterioration and the read-disturb. Therefore, the CPU 4 periodically reads out the data in the block registered to the first management table 31 from the NAND flash memory 10, checks the error count, and monitors increasing tendency in the error count of the data. The CPU 4 performs a refresh operation on the block when the error count of errors that have occurred in the data stored in the block exceeds a specified number.

If the error count is detected from only the data read out from the NAND flash memory 10 in response to a read request by the host device 2, the aged deterioration occurring in data stored in a block that is rarely read out from the NAND flash memory 10 cannot be detected. Therefore, it is preferable that data in all areas of the first management table 31 in the NAND flash memory 10 is read at an arbitrary timing and the error count of the data is checked. The arbitrary timing can be when power is turned on, an interval of once every few months, and the like. As a result, the increasing tendency in the error count can be monitored for the data stored in blocks that are rarely read out.

Figure 4:
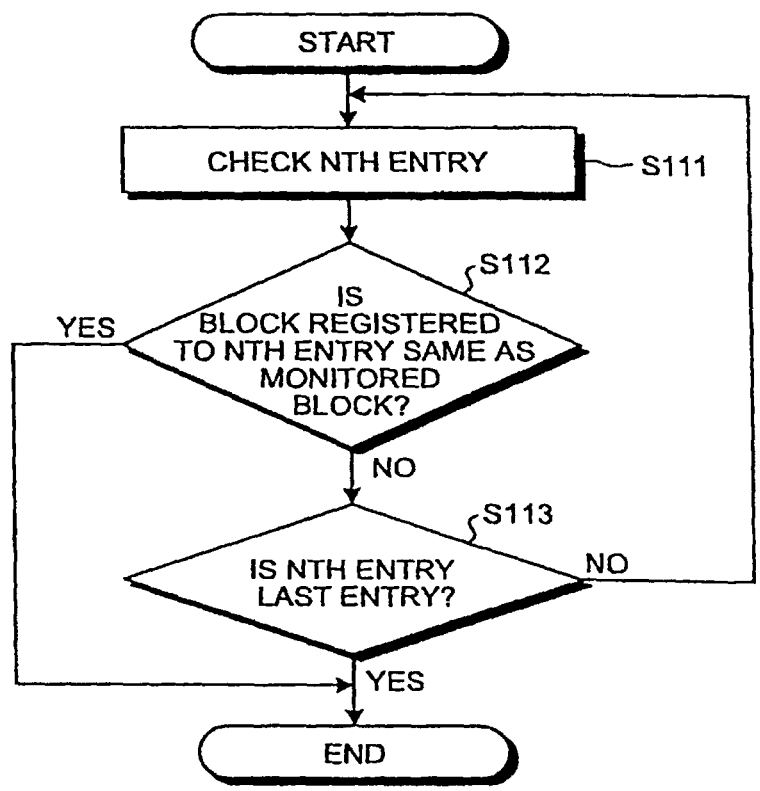
FIG. 4 is a flowchart of a monitored block registering process for registering a monitored block to the first management table in the semiconductor storage device according to the first embodiment.

FIG. 4 is a flowchart of a process for checking whether a block newly selected as the monitored block is already registered to the first management table 31. First, the CPU 4 checks content registered in an Nth entry (N is an entry number in the first management table 31) in the first management table 31 (Step S111). The CPU 4 judges whether a block registered to the Nth entry is the same as the block newly selected as the monitored block (Step S112).

When the block registered to the Nth entry is the same as the block newly selected as the monitored block (Yes at Step S112), the CPU 4 completes the process. When the block registered to the Nth entry is not the same as the block newly selected as the monitored block (No at Step S112), the CPU 4 checks whether the Nth entry is a last entry (Step S113). When the Nth entry is not the last entry (No at Step S113), the CPU 4 returns to Step S111 and increments the entry number by one. When the Nth entry is the last entry (Yes at Step S113), the CPU 4 completes the process.

Figure 5:
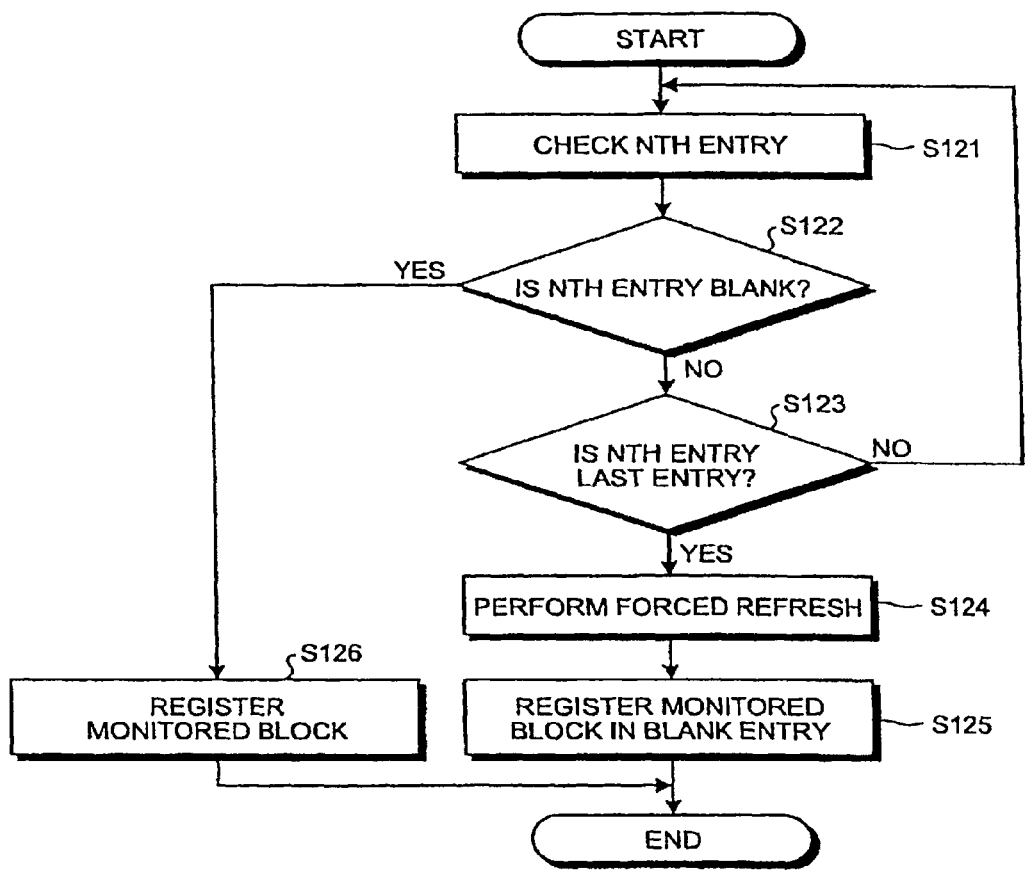
FIG. 5 is a flowchart of a registering process for registering a block to the first management table in the semiconductor storage device according to the first embodiment.

Here, when a block newly selected as the monitored block is not registered to the first management table 31, this block is registered to the first management table 31 as shown in a flowchart in FIG. 5. FIG. 5 is a flowchart of a process for registering the monitored block to the first management table 31.

First, the CPU 4 checks the Nth entry (N is an entry number in the first management table 31) (Step S121) in the first management table 31 and judges whether the Nth entry is a blank entry (Step S122). When the Nth entry is a blank entry (Yes at Step S122), the CPU 4 registers the monitored block to the blank entry (Step S126) and completes the process.

When the Nth entry is not a blank entry (No at Step S122), the CPU 4 checks whether the Nth entry is the last entry (Step S123). When the Nth entry is not the last entry (No at Step S123), the CPU 4 returns to Step S121 and increments the entry number by one. When the Nth entry is the last entry (Yes at Step S123), the CPU 4 forcibly performs the refresh operation on a block registered to the first management table 31 and creates a blank entry in the first management table 31 (Step S124). Since the error count of the data in the refreshed block decreases, the CPU 4 deletes the block from the first management table 31. The CPU 4 then registers the new monitored block to the blank entry (Step S125) and completes the process.

Figure 6:
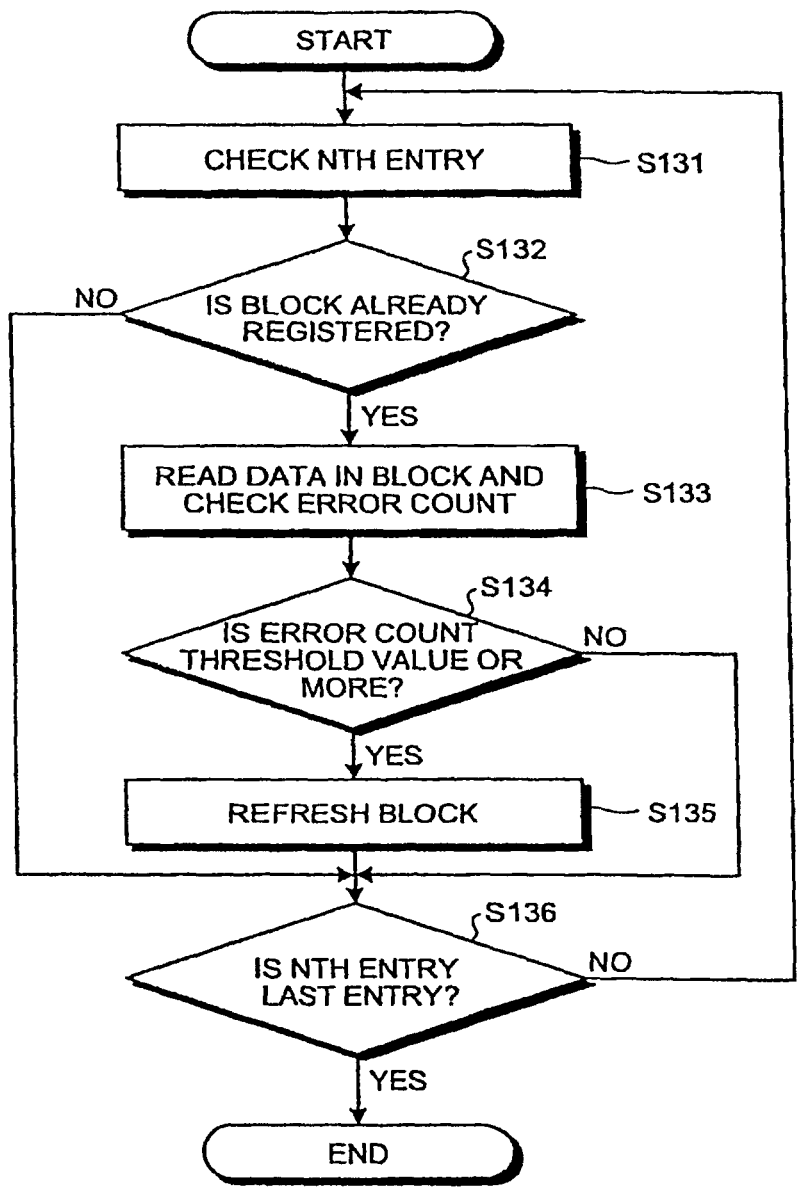
FIG. 6 is a flowchart of an error count monitoring process performed on a block registered to the first management table in the semiconductor storage device according to the first embodiment.

Next, a method of monitoring the error count of the data in the block registered to the first management table 31 will be described. The CPU 4 sets a monitoring interval period in the timer 7 within the controlling unit 3. Whenever the timer 7 generates an interrupt, the error count is monitored by a method shown in a flowchart in FIG. 6. FIG. 6 is a flowchart of a process for monitoring the error count of the block registered to the first management table 31.

First, the CPU 4 checks the Nth entry (N is an entry number in the first management table 31) in the first management table 31 (Step S131). The CPU 4 judges whether a block is already registered to the Nth entry (Step S132). When a block is not registered (No at Step S132), the CPU 4 checks whether the Nth entry is the last entry (Step S136). When the Nth entry is not the last entry (No at Step S136), the CPU 4 returns to Step S131 and increments the entry number by one. When the Nth entry is the last entry (Yes at Step S136), the CPU 4 completes the process.

At Step S132, when a block is already registered (Yes at Step S132), the CPU 4 reads out the data in the block registered to the Nth entry from the NAND flash memory 10 to the RAM 5 within the controlling unit 3. Next, the error correcting unit 21 corrects an error in the read data. The error count detecting unit 22 detects the count of corrected errors and stores therein the detected error count. The CPU 4 accesses the error count detecting unit 22, obtains the error count of the errors that have occurred in the read data, and checks the error count (Step S133). The CPU 4 then judges whether the error count of the read data is equal to a second threshold value or more (Step S134). The second threshold value is a threshold value of the error count used to select a block in which data is to be rewritten (refreshed) by a predetermined method. Here, for example, the second threshold value is a four-bit. The second threshold value is set taking into consideration the correction capability of the error correcting code.

When the error count is less than the second threshold value (less than four bits) (No at Step S134), the CPU 4 checks whether the Nth entry is the last entry (Step S136). When the Nth entry is not the last entry (No at Step 136), the CPU 4 returns to Step S131 and increments the entry number by one. When the Nth entry is the last entry (Yes at Step S136), the CPU 4 completes the process.

At Step S134, when the error count is equal to the second threshold value or more (four bits or more) (Yes at Step S134), the CPU 4 performs a refresh operation on the block registered to the Nth entry (Step S135). The CPU 4 then checks whether the Nth entry is the last entry (Step S136). When the Nth entry is not the last entry (No at Step S136), the CPU 4 returns to Step S131 and increments the entry number by one. When the Nth entry is the last entry (Yes at Step S131), the CPU 4 completes the process.

According to the first embodiment, an error count threshold value (second threshold value) for refreshing the monitored block registered in the first management table 31 is set to be greater than an error count threshold value (first threshold value) for registering a block as the monitored block to the first management table 31. This setting allows a block with a low error count to be monitored, and a block with a high error count to be refreshed because there is a possibility that data in a block with a high error count cannot be restored.

Figure 7:
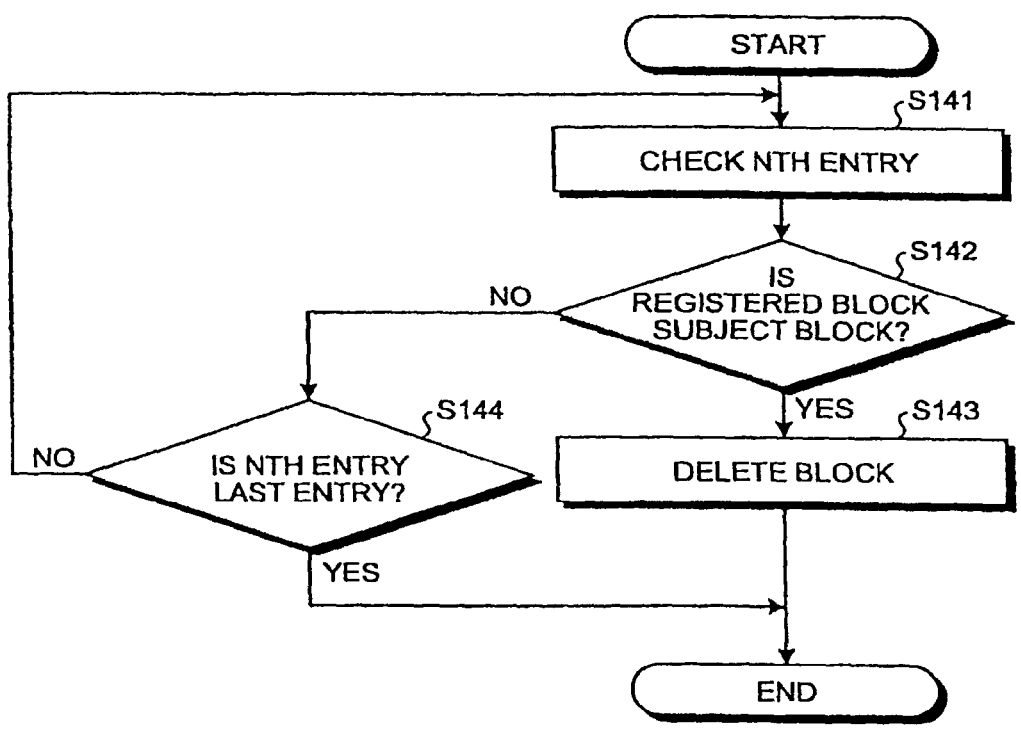
FIG. 7 is a flowchart of a deleting process for deleting a block on which a refresh operation has been performed from the first management table in the semiconductor storage device according to the first embodiment.

To perform the refresh operation on the block, first, all data in the block to be refreshed are read out from the NAND flash memory 10 to the RAM 5 within the controlling unit 3. The block in the NAND flash memory 10 is erased. Then, after the block is erased, all data migrated to the RAM 5 are rewritten in the deleted block. The error count of the data in the refreshed block decrease. Therefore, the block is deleted from the first management table 31 by a method shown in FIG. 7, and is excluded from monitored blocks. FIG. 7 is a flowchart of a process for deleting the refreshed block from the first management table 31.

First, the CPU 4 checks the Nth (N is an entry number in the first management table 31) entry in the first management table 31 (Step S141). The CPU 4 judges whether the registered block is a subject block, namely a refreshed block (Step S142). When the block is not the subject block (No at Step S142), the CPU 4 checks whether the entry is the last entry (Step S144). When the entry is not the last entry (No at Step S144), the CPU 4 returns to Step S141 and increments the entry number by one. When the entry is the last entry (Yes at Step S144), the CPU 4 completes the process.

At Step S142, when the registered block is the subject block (Yes at Step S142), the CPU 4 deletes the block registered in the Nth entry from the first management table 31 (Step S143) and completes the process. The data can be rewritten in another empty block rather than being rewritten in the block in which the data had originally been written.

As described above, in the semiconductor storage device 1 according to the first embodiment, the block in the NAND flash memory 10 storing the data that will require the refresh operation to be performed in the near future, due to the influence of the aged deterioration and the read-disturb, is selected based on the error count of errors occurring in the data stored in the block. The selected block is registered in the first management table 31 as the monitored block of which the error count of the data is monitored. Then, the data in the block registered to the first management table 31 is periodically read and the error count is checked. When the error count of the data exceeds a specified number, the refresh operation is performed. In this way, an interval at which the refresh operation is performed on the block can be extended within a range of the correction capability of the error correcting code, thereby reducing the number of refresh operation performed. The number of times the NAND flash memory 10 is rewritten can be controlled. As a result, data corruption caused by the aged deterioration and the read-disturb can be prevented with more certainty by the refresh operation being less frequently performed. Moreover, a semiconductor storage device can be actualized in which an amount of processing and power consumption during the refresh operation is suppressed.

In the semiconductor storage device 1 according to the first embodiment, the error count threshold value (second threshold value) for refreshing the monitored block registered to the first management table 31 is greater than the error count threshold value (first threshold value) for registering a block as the monitored block to the first management table 31. As a result, blocks among the monitored blocks having a high error count can be refreshed, thereby preventing an instance in which data cannot be restored.

[Second Embodiment]

According to a second embodiment, a case that a monitored block is selected based on a read-out amount of data stored in a block in the NAND flash memory 10 in the semiconductor storage device 1 of FIG. 1 is described. A method of registering the monitored block according to the second embodiment differs from that according to the first embodiment. Other aspects according to the second embodiment are the same as those according to the first embodiment.

Figures 8, 9:
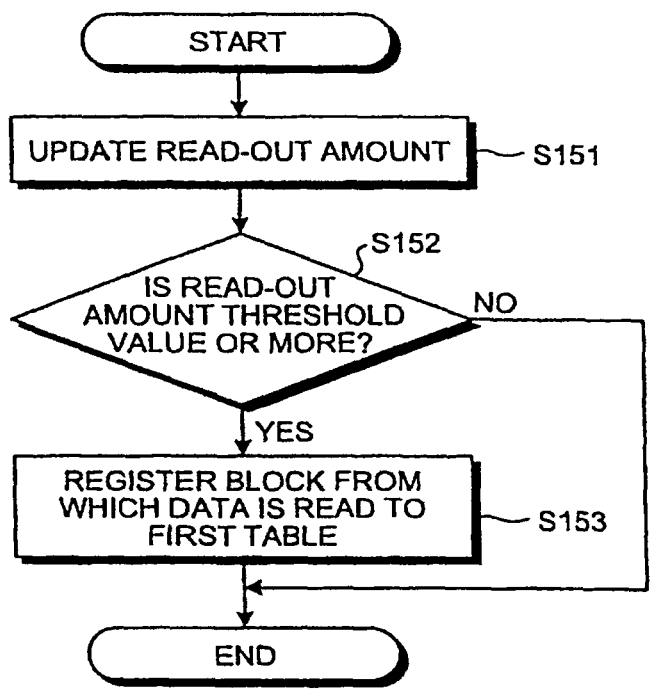
FIG. 8 is a diagram explaining a configuration of a second management table in the semiconductor storage device according to the first embodiment.
FIG. 9 is a flowchart of a monitored block selecting process performed in the semiconductor storage device according to the first embodiment.

FIG. 8 is a diagram explaining a configuration of a second management table 32. The second management table 32 is a management table storing therein a read-out amount of data in a block in the NAND flash memory 10. The second management table 32 is configured in the RAM 5. The second management table 32 stores each of the block numbers in the NAND flash memory 10 and read-out amounts of data read from the blocks.

Whenever the CPU 4 reads out data from a block in the NAND flash memory 10, the CPU 4 counts a read-out amount of the data by a number of pages. The CPU 4 stores a page count in the second management table 32 and updates the page count. The read-out amount stored in the second management table 32 is a read-out amount counted after the data is stored in the block in the NAND flash memory 10. A value of the read-out amount is cleared whenever the data in the block is erased. An integrated quantity of data volume or a read-out frequency can be used as the read-out amount of the data.

According to the second embodiment, when a read-out process for reading out data from the NAND flash memory 10 in response to a request from the host device 2 is performed, whether to monitor a block in which an error has occurred is decided through procedures shown in FIG. 9. FIG. 9 is a flowchart of a monitored block selecting process according to the second embodiment.

First, when the read-out process for reading the data from a block in the NAND flash memory 10 in response to a request from the host device 2 is performed, the CPU 4 updates a read-out amount in the second management table 32 of the data in the block (Step S151). The CPU 4 then checks whether the updated read-out amount of the data is equal to a third threshold value or more (Step S152). The third threshold value is a threshold value of the read-out amount of the data from the block used to select a block to be monitored. Here, for example, the third threshold value is a read-out amount of 10^10 pages.

When the read-out amount of the data from the block is equal to the third threshold value or more (Yes at Step S152), it is possible that an error count will further increase due to the influence of the aged deterioration and the read-disturb. An error exceeding a correction capability of an error correcting code may occur. Therefore, the CPU 4 registers the block from which the data is read out to the first management table 31 as the monitored block (Step S153). When the read-out amount of the data from the block is less than the third threshold value (No at Step S152), the CPU 4 completes the process without registering the block to the first management table 31. A method of monitoring the error count of the data in the blocks registered to the first management table 31 is similar to that according to the first embodiment. Detailed descriptions thereof are omitted.

As described above, in the semiconductor storage device 1 according to the second embodiment, the block in the NAND flash memory 10 storing the data that will require a refresh operation to be performed in the near future, due to the influence of the aged deterioration and the read-disturb, is selected based on the read-out amount of the data stored in the block. The selected block is registered in the first management table 31 as the monitored block of which the error count of the data is monitored. Then, the data in the block registered to the first management table 31 is periodically read and the error count is checked. When the error count of the data exceeds a specified number, the refresh operation is performed. In this way, an interval at which the refresh operation is performed on the block can be extended within a range of the correction capability of the error correcting code, thereby reducing a number of refresh operation performed. The number of times the NAND flash memory 10 is rewritten can be controlled. As a result, data corruption due to the aged deterioration and the read-disturb can be prevented with more certainty by the refresh operation being less frequently performed. Moreover, a semiconductor storage device can be actualized in which an amount of processing and power consumption during the refresh operation is suppressed.

[Third Embodiment]

According to a third embodiment, a case that a monitored block is selected based on a writing time at which data is written in a block in the NAND flash memory 10 in the semiconductor storage device 1 of FIG. 1 is described. A method of registering the monitored block according to the third embodiment differs from that according to the first embodiment. Other aspects according to the third embodiment are the same as those according to the first embodiment.

Figures 10, 11:
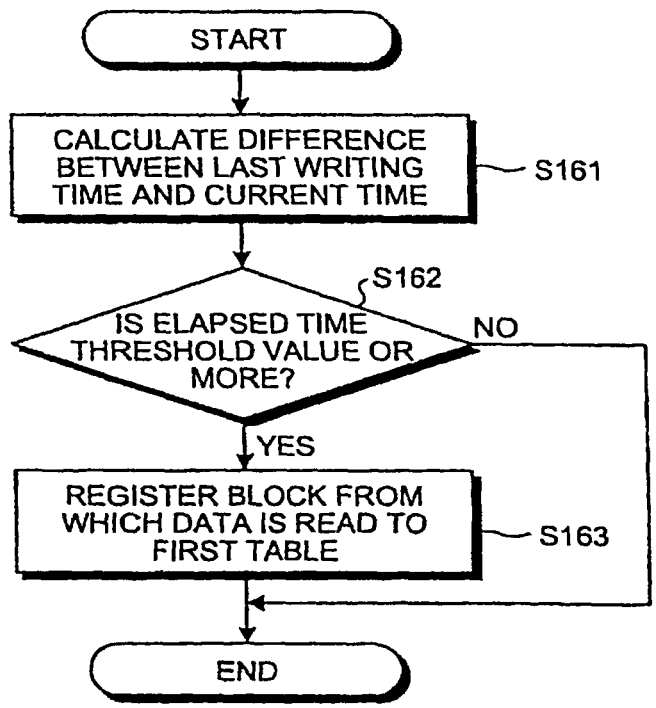
FIG. 10 is a diagram explaining a configuration of a third management table in the semiconductor storage device according to the first embodiment.
FIG. 11 is a flowchart of a monitored block selecting process performed in the semiconductor storage device according to the first embodiment.

FIG. 10 is a diagram explaining a configuration of a third management table 33. The third management table 33 is a management table storing therein a writing time at which data is written in a block in the NAND flash memory 10. The third management table 33 is configured in the RAM 5. The third management table 33 stores each of the block numbers in the NAND flash memory 10 and writing times at which data are written in the blocks.

When the CPU 4 writes data in the block in the NAND flash memory 10, the CPU 4 stores a writing time in the third management table 33. A value of the writing time stored in the third management table 33 is cleared whenever the data in the block in the NAND flash memory is erased. The writing time stored in the third management table 33 is merely required to indicate a time difference between a point in time at which the data is written and a current time, through use of a total number of erasures in the NAND flash memory and the like, in addition to an operating time of the semiconductor storage device 1.

According to the third embodiment, when a read-out process for reading data from the NAND flash memory 10 in response to a request from the host device 2 is performed, an amount of elapsed time from when the data is written in the block is measured through procedures shown in FIG. 11. A block of which the error count is to be monitored is decided. FIG. 11 is a flowchart of a monitored block selecting process according to the third embodiment.

First, when the read-out process for reading the data from the NAND flash memory 10 in response to the request from the host device 2 is performed, the CPU 4 calculates a difference between a writing time stored in the third management table 33 at which a last writing operation has been performed on the block from which the data is to be read, and a current time. In other words, the CPU 4 calculates an amount of elapsed time from the writing time of the block from which the data is to be read (Step S161). The CPU 4 then checks whether the elapsed time from the writing time of the block is equal to a fourth threshold value or more (Step S162). The fourth threshold value is a threshold value of an amount of time elapsed from a writing time of the block used to select the block to be monitored. Here, for example, the fourth threshold value is one month.

When the elapsed time from the writing time of the block is equal to the fourth threshold value or more (Yes at Step S162), it is possible that an error count will further increase due to the influence of the aged deterioration and the read-disturb. An error exceeding a correction capability of an error correcting code may occur. Therefore, the CPU 4 registers the block from which the data is read to the first management table 31 as the monitored block (Step S163). When the elapsed time from the writing time of the block is less than the fourth threshold value (No at Step S162), the CPU 4 completes the process without registering the block to the first management table 31. A method of monitoring the error count of the data in the blocks registered to the first management table 31 is similar to that according to the first embodiment. Detailed descriptions thereof are omitted.

If the elapsed time from the writing time of the block is checked only for the data read out from the NAND flash memory 10 in response to a read request by the host device 2, the aged deterioration occurring in data stored in a block that is rarely read out from the NAND flash memory 10 cannot be detected. Therefore, it is preferable that data in all areas of the first management table 31 in the NAND flash memory 10 is read at an arbitrary timing and the elapsed time from the writing time of the blocks is checked. The arbitrary timing can be when power is turned ON, an interval of once every few months, and the like. As a result, the increasing tendency in the error count can be monitored for the data stored in blocks that are rarely read.

As described above, in the semiconductor storage device 1 according to the third embodiment, the block in the NAND flash memory 10 storing the data that will require a refresh operation to be performed in the near future, due to the influence of the aged deterioration and the read-disturb, is selected based on the elapsed time from a last writing time of the block. The selected block is registered in the first management table 31 as the monitored block of which the error count of the data is monitored. Then, the data in the block registered to the first management table 31 is periodically read and the error count is checked. When the error count of the data exceeds a specified number, the refresh operation is performed. In this way, an interval at which the refresh operation is performed on the block can be extended within a range of the correction capability of the error correcting code, thereby reducing a number of refresh operation performed. A number of times the NAND flash memory 10 is rewritten can be controlled. As a result, data corruption due to the aged deterioration and the read-disturb can be prevented with more certainty by the refresh operation being less frequently performed. Moreover, a semiconductor storage device can be actualized in which an amount of processing and power consumption during the refresh operation is suppressed.

[Fourth Embodiment]

According to a fourth embodiment, a case that a monitored block is selected based on a sequence in which data is written in blocks in the NAND flash memory 10 in the semiconductor storage device 1 of FIG. 1 is described. A method of registering the monitored block according to the fourth embodiment differs from that according to the first embodiment. Other aspects according to the fourth embodiment are the same as those according to the first embodiment.

FIG. 12 is a diagram explaining a configuration of a fourth management table 34. The fourth management table 34 is a management table storing therein a sequence in which data is written in the blocks in the NAND flash memory 10. The fourth management table 34 is configured in the RAM 5. The fourth management table 34 stores each of the block numbers in the NAND flash memory 10 and corresponding sequence numbers in which data is written in the NAND flash memory 10.

When the CPU 4 writes data in a block in the NAND flash memory 10, the CPU 4 stores the sequence number in which the data is written in the NAND flash memory 10 in the fourth management table 34 and updates the fourth management table 34. The fourth management table 34 is preferably actualized by a linked structure or the like, such that processes to be performed do not increase even when writing sequence numbers are updated whenever a writing process is performed. As a result, processing load placed on the CPU 4 can be reduced and processing time can be shortened.

Figure 13:
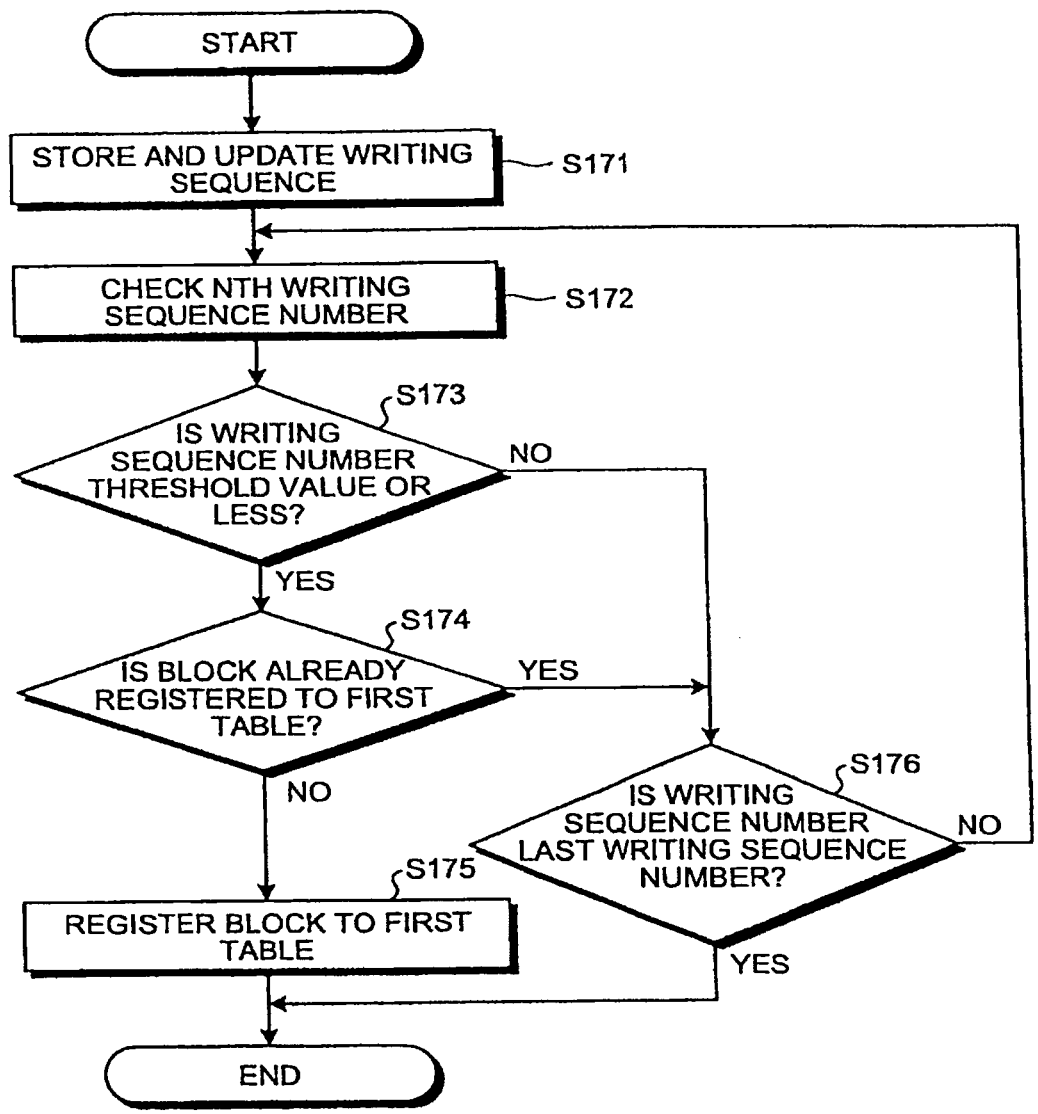
FIG. 13 is a flowchart of a monitored block selecting process performed in the semiconductor storage device according to the first embodiment.

According to the fourth embodiment, when a writing process for writing data in the NAND flash memory 10 in response to a request from the host device 2 is performed, a sequence number in which data is written in the blocks in the NAND flash memory 10 is stored and the sequence numbers are updated through procedures shown in FIG. 13. A block of which the error count is to be monitored is decided based on the writing sequence number. FIG. 13 is a flowchart of a monitored block selecting process according to the fourth embodiment.

First, when the writing process for writing the data in the block in the NAND flash memory 10 in response to the request from the host device 2 is performed, the CPU 4 stores the writing sequence number in the fourth management table 34 and updates the writing sequence numbers (Step S171). The CPU 4 then checks a block corresponding to an Nth writing sequence number (N is a writing sequence number in the fourth management table 34) in the fourth management table 34 (Step S172). The CPU 4 checks whether the writing sequence number is equal to a fifth threshold value or less or, in other words, whether the block is older than the fifth threshold value (Step S173). The fifth threshold value is a threshold value of a writing sequence used to select the block to be monitored. Here, for example, the fifth threshold value is ten blocks from a block with an oldest (smallest) writing sequence number.

When the writing sequence number is equal to the fifth threshold value or less or, in other words, the block is older than the fifth threshold value (Yes at Step S173), it is possible that an error count will further increase due to the influence of the aged deterioration and the read-disturb. An error exceeding a correction capability of an error correcting code may occur. Therefore, the CPU 4 checks whether the block is registered to the first management table 31 (Step S174). When the block is not registered to the first management table 31 (No at Step S174), the CPU registers the block to the first management table 31 as the monitored block (Step S175). In other words, the CPU registers the block that has been written further in the past than the fifth threshold value in the first management table 31 as the monitored block, and checks the error count of the data.

At Step S174, when the block is already registered to the first management table 31 (Yes at Step S174), the CPU 4 checks whether the Nth writing sequence number is a last writing sequence number (Step S176). When the Nth writing sequence number is not the last writing sequence number (No at Step S176), the CPU 4 returns to Step S172 and increments the writing sequence number by one. When the Nth writing sequence number is the last writing sequence number (Yes at Step S176), the CPU 4 completes the process.

At Step S173, when the writing sequence number is not equal to the fifth threshold value or less or, in other words, is a newer block than the fifth threshold value (No at Step S173), the CPU 4 checks whether the Nth writing sequence number is the last writing sequence number (Step S176). When the Nth writing sequence number is not the last writing sequence number (No at Step S176), the CPU 4 returns to Step S172 and increments the writing sequence number by one. When the Nth writing sequence number is the last writing sequence number (Yes at Step S176), the CPU 4 completes the process. A method of monitoring the error count of the data in the blocks registered to the first management table 31 is similar to that according to the first embodiment. Detailed descriptions thereof are omitted.

As described above, in the semiconductor storage device 1 according to the fourth embodiment, the block in the NAND flash memory 10 storing the data that will require a refresh operation to be performed in the near future, due to the influence of the aged deterioration and the read-disturb, is selected based on the sequence in which the data are written in the blocks in the NAND flash memory 10. The selected block is registered in the first management table 31 as the monitored block of which the error count in the data is monitored. Then, the data in the block registered to the first management table 31 is periodically read and the error count is checked. When the error count of the data exceeds a specified number, the refresh operation is performed. In this way, an interval at which the refresh operation is performed on the block can be extended within a range of the correction capability of the error correcting code, thereby reducing a number of refresh operations performed. The number of times the NAND flash memory 10 is rewritten can be controlled. As a result, data corruption due to the aged deterioration and the read-disturb can be prevented with more certainty by the refresh operation being less frequently performed. Moreover, a semiconductor storage device can be actualized in which an amount of processing and power consumption during the refresh operation is suppressed.

[Fifth Embodiment]

According to a fifth embodiment, a process performed when a blank entry is not available when a block is registered to the first management table 31 in the semiconductor storage device 1 according to the first embodiment to the fourth embodiment is described.

FIG. 14 is a diagram explaining a configuration of a fifth management table 35. The fifth management table 35 is a management table storing therein a registration sequence of monitored blocks registered to the first management table 31. The fifth management table 35 is configured in the RAM 5. The fifth management table 35 stores numbers of monitored blocks registered to the first management table 31 and sequence numbers of a sequence in which the monitored blocks are registered to the first management table 31 (registration sequence number).

When the monitored blocks are registered to the first management table 31, the monitored blocks are sequentially stored such that a monitored block that is registered earlier has a lower entry number in the first management table 31. According to the fifth embodiment, whenever the CPU 4 registers a monitored block to the first management table 31, the CPU 4 registers a block number of the monitored block to the fifth management table 35. The fifth management table 35 is preferably actualized by a linked list because the CPU 4 updates the registration sequence numbers whenever a monitored block is registered to or deleted from the first management table 31. As a result, processing load placed on the CPU 4 can be reduced and processing time can be shortened.

Figure 15:
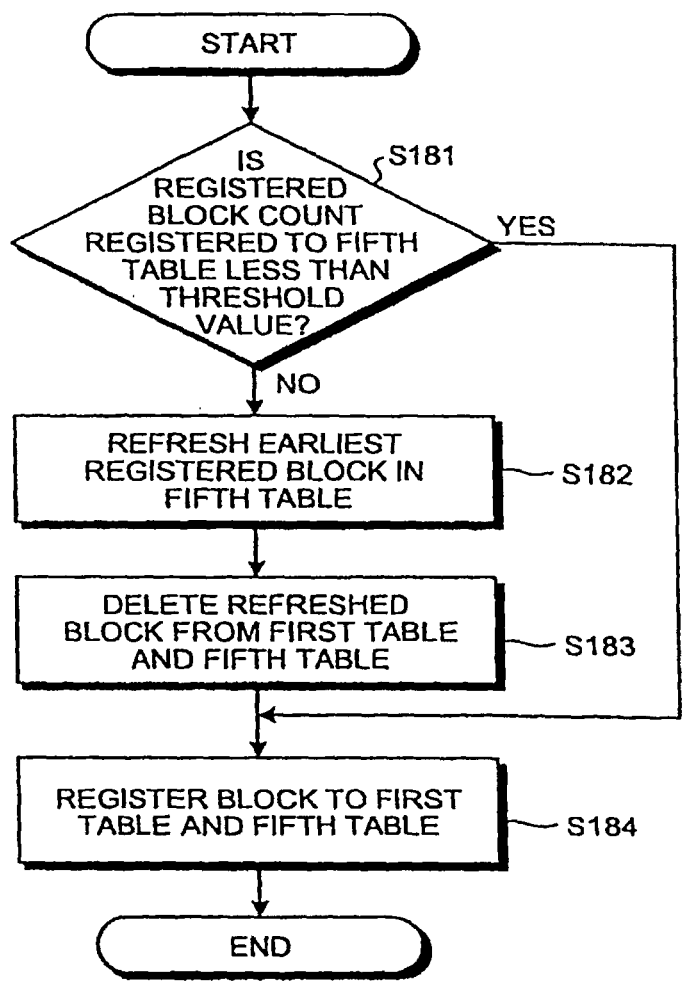
FIG. 15 is a flowchart of a registering process for registering a block to the first management table in the semiconductor storage device according to the first embodiment.

A registering process for registering a monitored block to the first management table 31 performed when a blank entry is not available when the monitored block is registered to the first management table 31 will be described hereafter with reference to FIG. 15. FIG. 15 is a flowchart of a registering process for registering the monitored block to the first management table 31 according to the fifth embodiment.

First, when the registering process for registering the monitored block to the first management table 31 is performed, the CPU 4 checks whether a registered block count of blocks registered to the fifth management table 35 is less than a sixth threshold value (Step S181). Here, the sixth threshold value is a maximum number of blocks that can be registered to the first management table 31 and a maximum number of blocks that can be registered to the fifth management table 35. Therefore, the registered block count of the blocks registered to the fifth management table 35 being less than the sixth threshold value indicates that a blank entry is available in the first management table 31. The registered block count of the blocks registered to the fifth management table 35 not being less than the sixth threshold value indicates than a blank entry is not available in the first management table 31.

When the registered block count of the blocks registered to the fifth management table 35 is less than the sixth threshold value or, in other words, a blank entry is available in the first management table 31 (Yes at Step S181), the CPU 4 registers the monitored block to the blank entry in the first management table 31 (Step S184). The CPU 4 further registers the block number of the monitored block to the fifth management table 35 and completes the process.

When the registered block count of the blocks registered to the fifth management table 35 is less than the sixth threshold value (when a blank entry is not available in the first management table 31) (No at Step S181), the CPU 4 references the fifth management table 5 and refreshes data in the monitored block of which the registration sequence number in the fifth management table 35 is earliest (Step S182). In other words, the CPU 4 refreshes data in the block that has been registered to the first management table 31 and the fifth management table 35 earliest.

The CPU 4 then deletes the refreshed block from the first management table 31 and the fifth management table 35 (Step S183). Subsequently, the CPU 4 registers the new monitored block to the blank entry in the first management table 31. The CPU 4 then registers the monitored block registered to the blank entry in the first management table 31 to the fifth management table 35 (Step S184).

As described above, in the semiconductor storage device 1 according to the fifth embodiment, as a result of blank entries in the first management table 31 being managed, a new monitored block can be registered to the first management table 31 even when a blank entry is not available when the monitored block is registered to the first management table 31. The monitored blocks storing data of which the error count is monitored can be managed.

[Sixth Embodiment]

According to a sixth embodiment, a process performed when a block that has become excluded from data error count monitoring is deleted from the first management table 31 in the semiconductor storage device 1 according to the first embodiment to the fifth embodiment is described.

FIG. 16 is a diagram explaining a configuration of a sixth management table 36. The sixth management table 36 is a management table storing therein blocks in the NAND flash memory 10 in which data to be retained is not stored. The sixth management table 36 is configured in the RAM 5. In the sixth management table 36, a block number of a block that does not store therein data to be retained, among block numbers of blocks in the NAND flash memory 10, is registered in each entry. The sixth management table 36 is accessed by entry numbers.

The CPU 4 acquires information from the sixth management table 36 on a block that does not store therein data to be retained and, as a result, can write a new data in the block. The CPU 4 also registers the block in which the data to be retained is no longer present to the sixth management table 36. A state in which the data to be retained is no longer present occurs mainly when a new data is written. For example, when data X of an address A is stored in a block 1 in the NAND flash memory 10, in a control method in which control is performed to write data Y of the address A to another block (such as a block 100) when the host device 2 requests that the data X of the address A is rewritten to the data Y, the previous data X of the address A stored in the block 1 is no longer data to be retained (invalid data).

Figure 17:
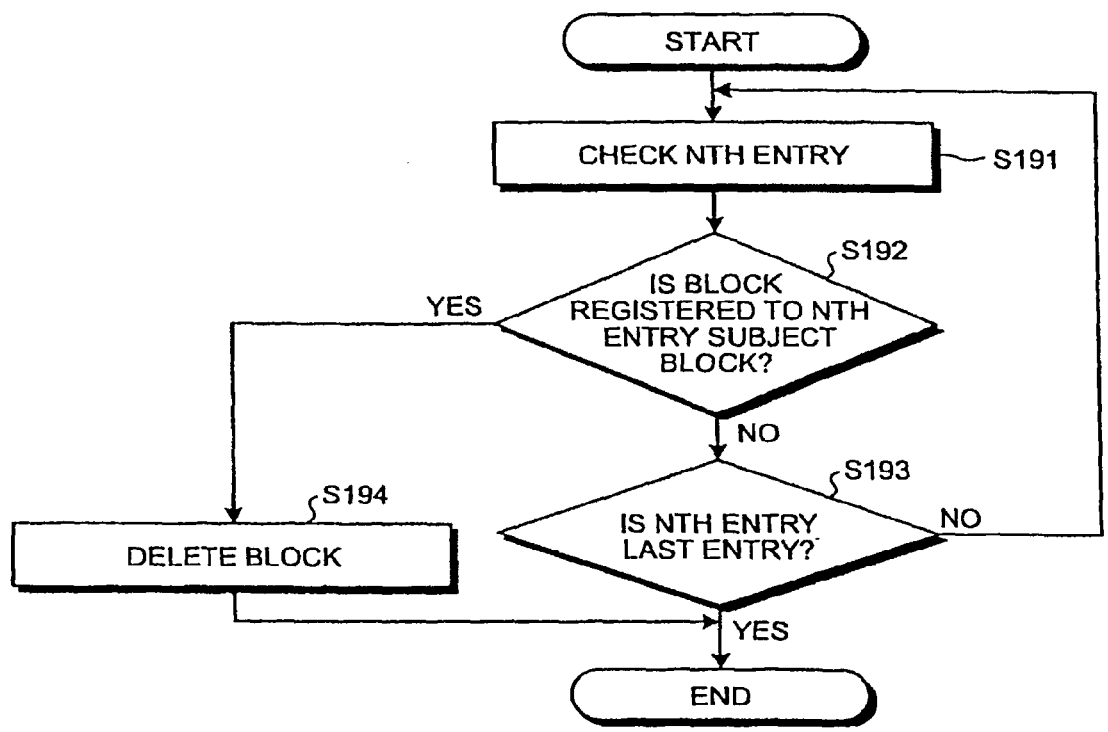
FIG. 17 is a flowchart of a deleting process for deleting a block excluded from error count monitoring from a first management table of a semiconductor storage device according to a sixth embodiment.

A process performed when the monitored block that has become excluded from data error count monitoring is deleted from the first management table 31 will be described hereafter with reference to FIG. 17. FIG. 17 is a flowchart of a deleting process for deleting a block excluded from error count monitoring from the first management table according to the sixth embodiment.

First, when a block is generated in which data to be retained is no longer present, the CPU 4 checks an Nth entry (N is an entry number in the first management table 31) in the first management table 31 (Step S191). The CPU 4 judges whether a block registered to the Nth entry is a subject block (a block excluded from monitoring in which the data to be retained is no longer present) (Step S192). When the block is not the subject block (No at Step S192), the CPU 4 judges whether the entry is a last entry (Step S193).

Here, when the entry is not the last entry (No at Step S193), the CPU 4 returns to Step S191 and increments the entry number by one. When the entry is the last entry (Yes at Step S193), the CPU 4 completes the process.

At Step S192, when the block is the subject block (Yes at Step S192), the CPU 4 performs a deleting process to delete the block from the first management table 31. The CPU 4 registers the block number of the block to the sixth management table 36 and completes the process (Step S194). The block registered to the sixth management table 36 is not required to be updated because the block does not store therein data to be retained.

As described above, in the semiconductor storage device 1 according to the sixth embodiment, when a block is generated that is excluded from monitoring and in which data to be retained is no longer present when, for example, new data is written in the block in the NAND flash memory in which the data is stored, the block that is excluded from monitoring can be deleted from the first management table 31 with certainty, and blank entries in the first management table 31 can be managed.

[Seventh Embodiment]

According to a seventh embodiment, a method of monitoring a monitored block registered to the first management table 31 in the semiconductor storage device 1 according to the first embodiment to the sixth embodiment is described.

FIG. 18 is a diagram explaining a configuration of a seventh management table 37. The seventh management table 37 is a management table storing therein error counts of blocks in the NAND flash memory 10 registered to the first management table 31. The seventh management table 37 is configured in the RAM 5. The seventh management table 37 includes a plurality of entries. A block number of a block registered to the first management table 31 and an error count detected from data stored in the block are registered to each entry. The seventh management table 37 is accessed by an entry number. Values of the error counts registered to the seventh management table 37 are updated whenever error count monitoring is performed.

Figure 19:
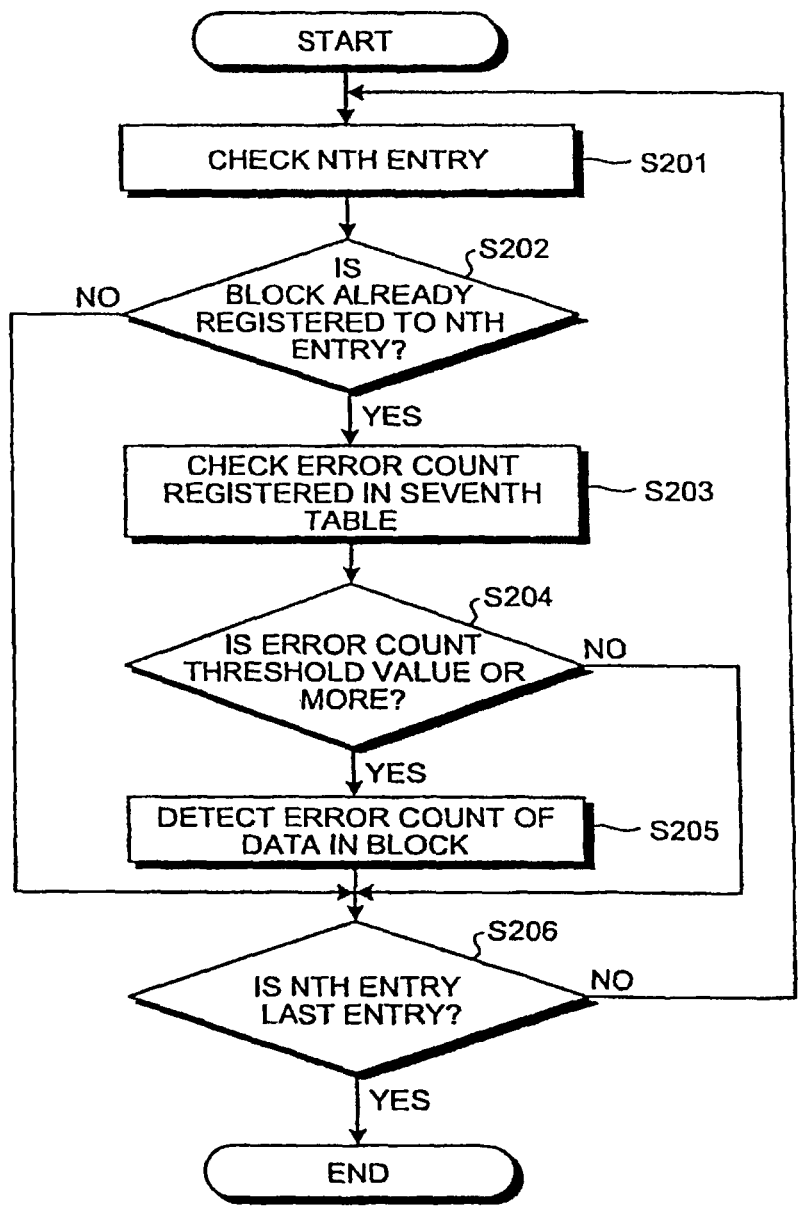
FIG. 19 is a flowchart of an error count monitoring process performed on a monitored block registered to a first management table in a semiconductor storage device according to a seventh embodiment.

The method of monitoring the error count of a monitored block registered to the first management table 31 will be described hereafter with reference to FIG. 19. FIG. 19 is a flowchart of an error count monitoring process performed on the monitored block registered to the first management table 31.

The CPU 4 sets a monitoring interval period in the timer 7 within the controlling unit 3. The error count monitoring process on the monitored block registered to the first management table 31 is performed whenever an interrupt is generated by the timer 7. The timer 7 internally measures time when the CPU sets the monitoring interval period. After the set period elapses, the timer 7 generates an interrupt to the CPU 4.

When the timer 7 generates the interrupt, the CPU 4 checks an Nth entry (N is an entry number in the seventh management table 37) of the seventh management table 37 (Step S201). The CPU 4 judges whether a block is already registered to the Nth entry (Step S202). When a block is not registered (No at Step S202), the CPU 4 judges whether the Nth entry is a last entry (Step S206). When the Nth entry is not the last entry (No at Step S206), the CPU 4 returns to Step S201 and increments the entry number by one. When the Nth entry is the last entry (Yes at Step S206), the CPU 4 completes the error count monitoring process.

At Step S202, when a block is already registered (Yes at Step S202), the CPU 4 checks an error count (number of bits) of the block registered to the seventh management table 37 (Step S203). The CPU 4 judges whether the error count is equal to a seventh threshold value or more (Step S204). The seventh threshold value is used to select a block on which an error count detecting process is to be performed, among the monitored blocks. Here, the seventh threshold value is, for example, four bits of error.

When the error count is less than the seventh threshold value (less than four bits) (No at Step S204), the CPU 4 checks whether the Nth entry is the last entry (Step S206). When the Nth entry is not the last entry (No at Step S206), the CPU 4 returns to Step S201 and increments the entry number by one. When the Nth entry is the last entry (Yes at Step S206), the CPU 4 completes the error count monitoring process.

At Step S204, when the error count is the seventh threshold value or more (four bits or more) (Yes at Step S204), the CPU 4 reads out the data in the block from the NAND flash memory 10 to the RAM 5 within the controlling unit 3 and performs an error count detecting process on the data (Step S205). The CPU 4 updates the seventh management table 37 with a detected error count. Based on the detected error count, the CPU 4 performs the refresh operation according to the first embodiment, described with reference to FIG. 6.

Next, the CPU 4 checks whether the Nth entry is the last entry (Step S206). When the Nth entry is not the last entry (No at Step S206), the CPU 4 returns to Step S201 and increments the entry number by one. When the Nth entry is the last entry (Yes at Step S206), the CPU 4 completes the error count monitoring process.

A value set as the above-described seventh threshold value decreases whenever the error count detecting process is performed, gradually facilitating error count detection to be performed on blocks with a low error count. As a result, the error count detection is performed each time on the blocks with a high error count over a short cycle. The error count detection is performed on the blocks with a low error count over a long cycle. The value set as the seventh threshold value returns to an original value after the value is decreased to a predetermined, specified value.

As described above, in the semiconductor storage device 1 according to the seventh embodiment, whether an error count detecting process is newly performed on a monitored block is judged for the monitored blocks registered to the first management table 31 based on the error counts registered to the seventh management table 37. The error count detection is performed on the blocks with a high error count over a short cycle. The error count detection is performed on the blocks with a low error count over a long cycle. As a result, the monitoring intervals of the monitored blocks registered to the first management table 31 can be changed based on the error counts registered to the seventh management table 37. The error count of the data in a block that will most likely require updating in the near future, among the monitored blocks registered to the first management table 31, can be monitored with certainty. At the same time, frequency of the error count monitoring can be reduced. As a result, an amount of calculations required to perform the error count monitoring and power consumption can be suppressed.

[Eighth Embodiment]

According to an eighth embodiment, an error count monitoring cycle according to the seventh embodiment will be described. According to the eighth embodiment, regarding a monitoring process performed on monitored blocks registered to the first management table 31, an upper limit is set for a monitoring cycle (monitoring interval period set in the timer 7) of blocks having a low error count.

Here, the upper limit of the monitoring cycle is set to be shorter than an amount of time required from when an error count of data stored in a block exceeds the first threshold value until the error count of the data stored in the block reaches an upper limit of a correction capability of the error correcting section 21. The monitoring cycle can be set in advance to a period predicted from an error occurrence state and various conditions, such as a range of ambient temperature, of the semiconductor storage device 1.

As a result of the upper limit being placed on the monitoring cycle of the blocks with a low error count as described above, an instance can be prevented in the block registered to the first management table 31 in which, because the block has a low error count, the errors in the data exceed the error correction capability of the error correcting section 21 because the error count of the data is not monitored for a long period of time, and the correct data cannot be reconstructed.

Functions provided according to the above-described first embodiment to eighth embodiment can be arbitrarily selected and used in an arbitrary combination.

EXAMPLES

Figure 20:
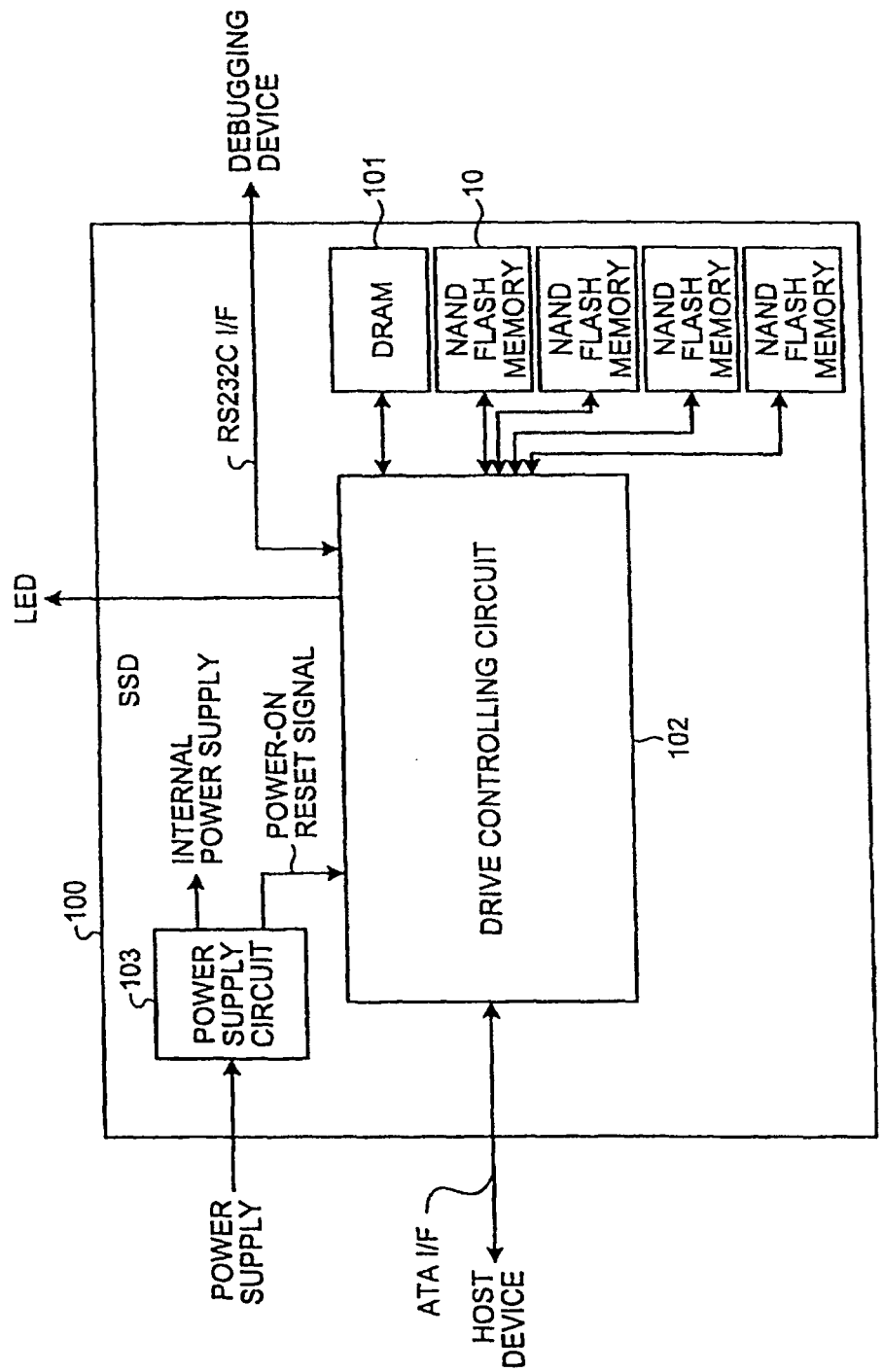
FIG. 20 is a block diagram of a configuration of an SSD in an example of the present invention.

An example of when the semiconductor storage device 1 according to each of the above-described embodiments is a solid state driver (SSD) will be described. FIG. 20 is a block diagram of a configuration of a SSD 100.

The SSD 100 includes a plurality of NAND flash memories (NAND memory) 10, a dynamic random access memory (DRAM) 101, a drive controlling circuit 102, and a power supply circuit 103. The NAND memories 10 are used to store data. The DRAM 101 is used for data transfer and as a work area. The drive controlling circuit 102 controls the NAND memories 10 and the DRAM 101. The drive controlling circuit 102 outputs a control signal for controlling a light-emitting diode (LED) provided outside of the SSD 100. The LED is used to indicate status.

The SSD 100 transmits and receives data to and from a host device, such as a personal computer, via an advanced technology attachment (ATA) interface (I/F). The SSD 100 transmits and receives data to and from a debugging device, via an RS-232C interface (I/F).

The power supply circuit 103 receives external power supply and generates a plurality of internal power supplies using the external power supply. The internal power supplies are supplied to each section within the SSD 100. The power supply circuit 103 detects a rise or fall of the external power supply and generates a power-ON reset signal. The power-ON reset signal is sent to the drive controlling circuit 102.

Figure 21:
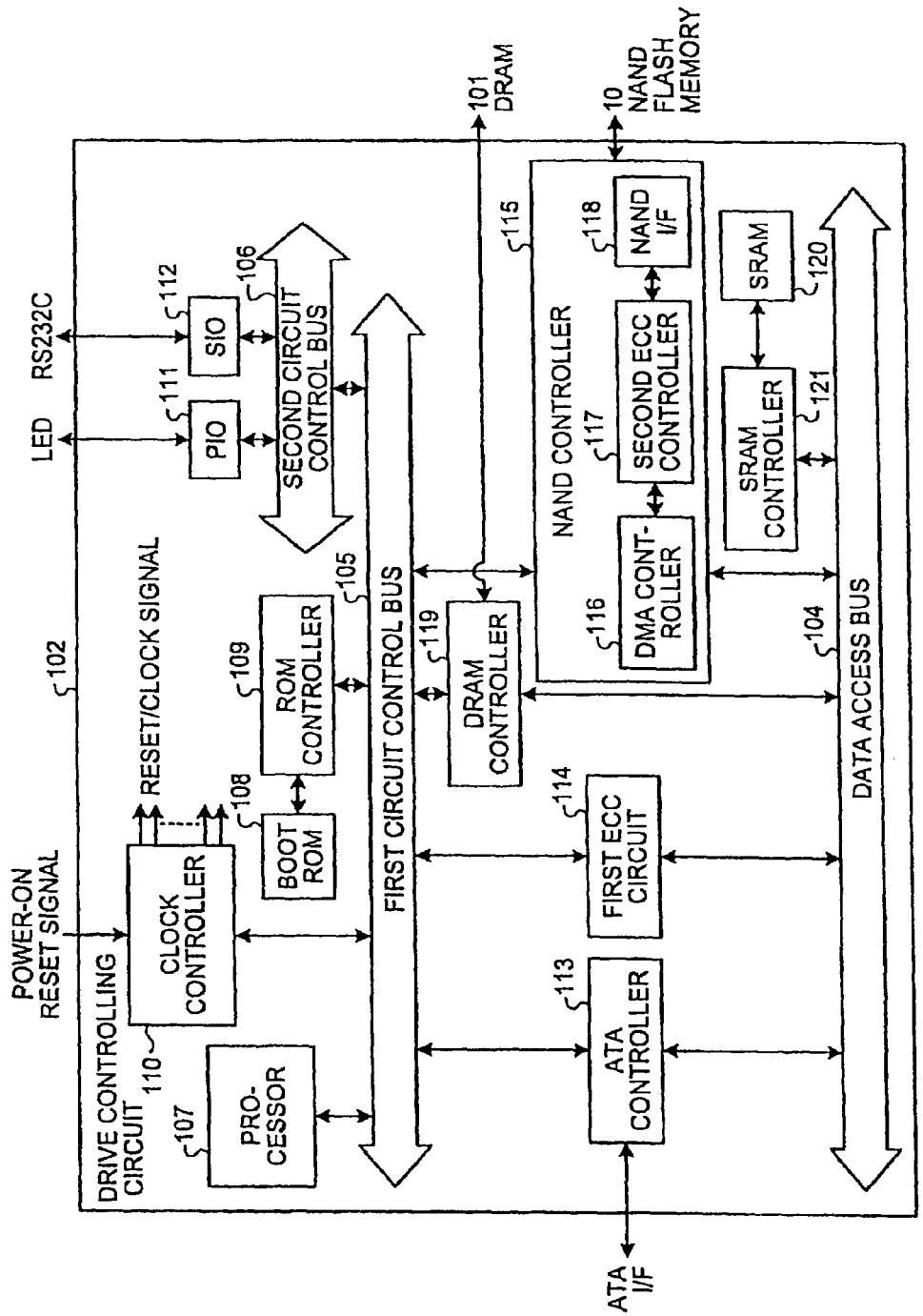
FIG. 21 is a block diagram of a configuration of a drive controlling circuit in the example.

FIG. 21 is a block diagram of a configuration of the drive controlling circuit 102. The drive controlling circuit 102 includes a data access bus 104, a first circuit controlling bus 105, and a second circuit controlling bus 106.

The first circuit controlling bus 105 is connected to a processor 107 that controls the overall drive controlling circuit 102. A boot read-only memory (ROM) 108 is also connected to the first circuit controlling bus 105, via a ROM controller 109. The boot ROM 108 stores a boot program of each management program (firmware [FW]). A clock controller 110 is also connected to the first circuit controlling bus 105. The clock controller 110 receives the power-ON reset signal from the power supply circuit 103 and supplies each section with a reset signal and a clock signal.

The second circuit controlling bus 106 is connected to the first circuit controlling bus 105. A parallel 10 (PIO) circuit 111 and a serial 10 (SIO) circuit 112 are connected to the second circuit controlling bus 106. The PIO circuit 111 supplies a status indicating signal to the LED used to indicate the status. The SIO circuit 112 controls the RS-232C interface.

An ATA interface controller (ATA controller) 113, a first error check and correct (ECC) circuit 114, an NAND controller 115, and a DRAM controller 119 are connected to both the data access bus 104 and the first circuit controlling bus 105. The ATA controller 113 transmits and receives data to and from the host device, via the ATA interface. A static random access memory (SRAM) 120 is connected to the data access bus 104, via a SRAM controller 121. The SRAM 120 is used as a data work area The NAND controller 115 includes an NAND interface (I/F) 118, a second ECC circuit 117, and a direct memory access (DMA) transfer controlling DMA controller 116. The NAND interface (I/F) 118 performs a process for interfacing with the four NAND memories 10. The DMA transfer controlling DMA controller 116 performs access control between the NAND memories 10 and the DRAM 101.

Figure 22:
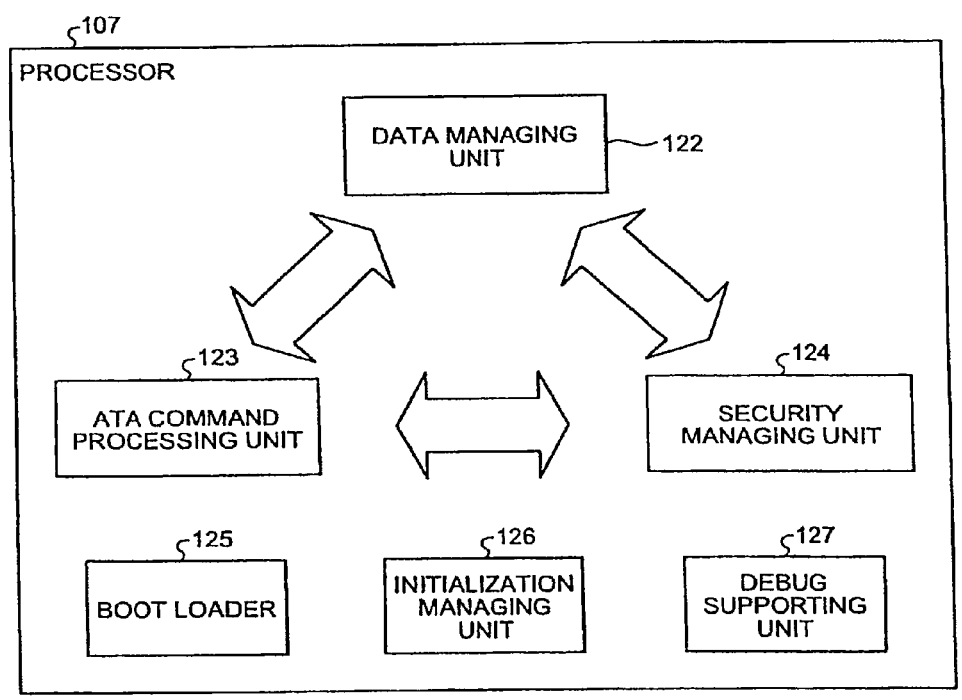
FIG. 22 is a block diagram of a configuration of a processor in the example of the present invention.

FIG. 22 is a block diagram of a configuration of a processor 107. The processor 107 includes a data managing unit 122, an ATA command processing unit 123, a security managing unit 124, a boot loader 125, an initialization managing unit 126, and a debug supporting unit 127.

The data managing unit 122 controls data transfer between the NAND memories 10 and the DRAM 101, and various functions related to an NAND chip, via the NAND controller 115 and the first ECC circuit 114.

The ATA command processing unit 123 performs a data transfer process in cooperation with the data managing unit 122, via the ATA controller 113 and the DRAM controller 119. The security managing unit 124 manages various pieces of security information in cooperation with the data managing unit 122 and the ATA command processing unit 123. The boot loader 125 loads each management program (FW) from the NAND memory 10 to the SRAM 120 when power is turned ON.

The initialization managing unit 126 performs initialization of each controller and circuit within the drive controlling circuit 102. The debug supporting unit 127 processes debugging data supplied from an external source via the RS-232C interface.

Figure 23:
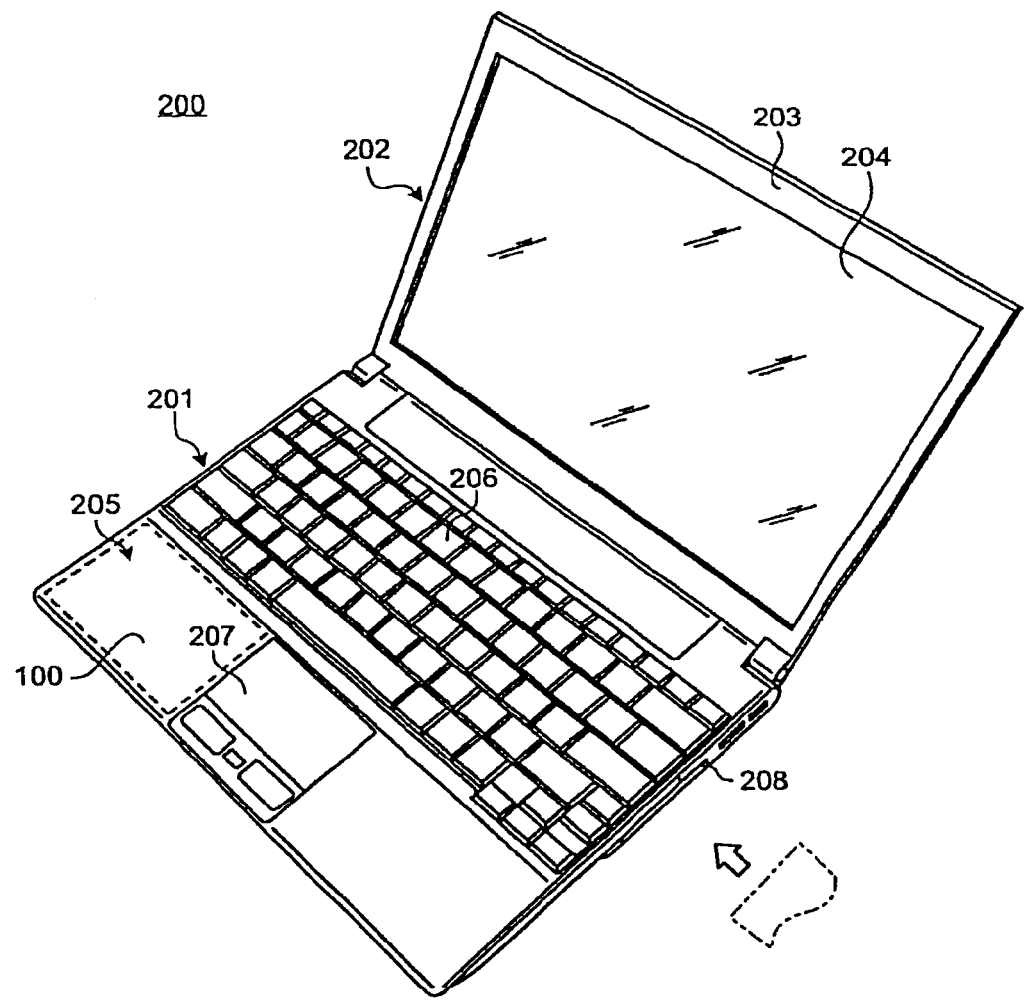
FIG. 23 is a perspective view of an example of a portable computer on which the SSD is mounted in the example.

FIG. 23 is a perspective view of an example of a portable computer 2000 on which the SSD 100 is mounted. The portable computer 200 includes a main body 201 and a display unit 202. The display unit 202 includes a display housing 203 and a display device 204 housed within the display housing 203.

The main body 201 includes a casing 205, a keyboard (KB) 206, and a touch pad 207 serving as a pointing device. The casing 205 houses therein a main circuit board, an optical disk drive (ODD), a card slot, the SSD 100, and the like.

The card slot is provided adjacent to a peripheral wall of the casing 205. An opening 208 facing the card slot is provided on the peripheral wall. A user can insert and remove an additional device into and from the card slot from outside of the casing 205, through the opening 208.

The SSD 100 can be used mounted within the portable computer 22 in place of a conventional hard disk drive (HDD). Alternatively, the SSD 100 can be used as an additional device by being inserted into the card slot provided in the portable computer 200.

Figure 24:
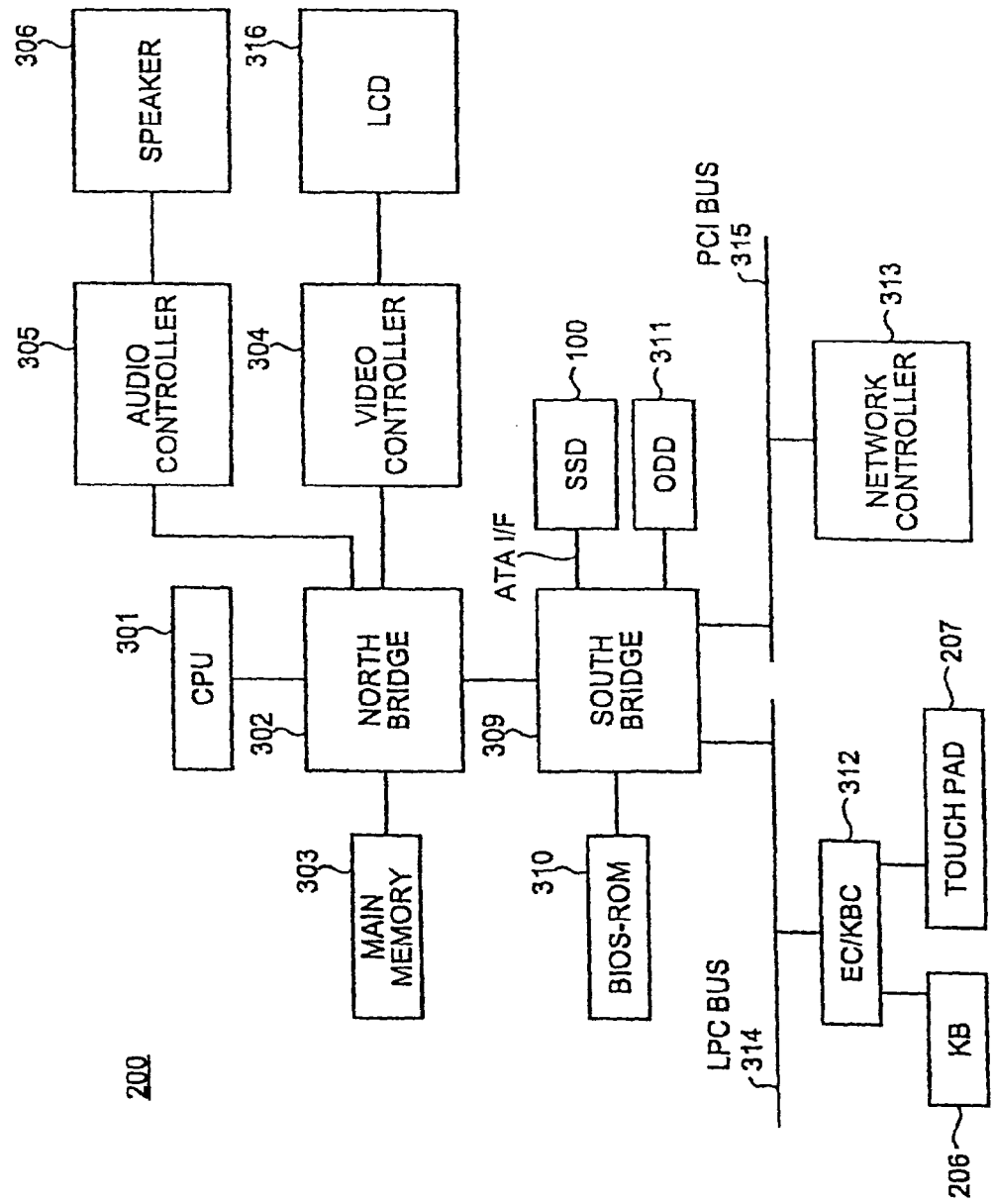
FIG. 24 is a diagram of an example of a system configuration of the portable computer on which the SSD is mounted in the example of the present invention.

FIG. 24 is a diagram of an example of a system configuration of the portable computer 200 on which the SSD 100 is mounted. The portable computer 200 includes a CPU 301, a north bridge 302, a main memory 303, a video controller 304, an audio controller 305, a south bridge 309, a basic input output system read-only memory (BIOS-ROM) 310, the SSD 100, an ODD unit 311, an embedded controller/keyboard controller integrated chip (IC) (EC/KBC) 312, a network controller 313 and the like.

The CPU 301 is a processor provided to control operation of the portable computer 200. The CPU 301 runs an operating system (OS) loaded onto a main memory 303 from the SSD 100. Moreover, when the ODD unit 311 can perform at least one process between reading from loaded optical disc and writing to the loaded optical disc, the CPU 301 performs the processes. The CPU 301 also runs a system BIOS stored in the BIOS-ROM 310. The system BIOS is a program for performing hardware control within the portable computer 200.

The north bridge 302 is a bridge device connecting a local bus of the CPU 301 and the south bridge 309. A memory controller that access-controls the main memory 303 is also included in the north bridge 302. The north bridge 302 also provides a function for communicating with the video controller 304 and the audio controller 305 via an accelerated graphics port (AGP) bus and the like.

The main memory 303 temporarily stores programs and data, and functions as a work area. The main memory 303 is, for example, configured by a DRAM.

The video controller 304 is a video reproduction controller that controls a liquid crystal display (LCD) 316 of the display unit 202 used as a display monitor of the portable computer 200.

The audio controller 305 is an audio reproduction controller that controls a speaker 306 on the portable computer 200.

The south bridge 309 controls each device on a low pin count bus 314 and each device on a peripheral component interconnect bus 315. The south bridge 309 also controls the SSD 100 via the ATA interface. The SSD 100 is a memory device storing various software and data The portable computer 200 accesses the SSD 100 in sector units. The portable computer 200 inputs a writing command, a read-out command, a flash command, and the like into the SSD 100, via the ATA interface.

The south bridge 309 also provides a function for access-controlling the BIOS-ROM 310 and the ODD unit 311.

The EC/KBD 312 is a single chip microcomputer in which an embedded controller for power management and a keyboard controller for controlling the KB 206 and the touch pad 207 are integrated. The EC/KBD 312 provides a function for turning ON and OFF the power supply of the portable computer 200 in response to operation of a power button by the user. The network controller 313 is a communication device that communicates with an external network, such as the Internet.

The semiconductor storage device 1 according to each of the above-described embodiments is not limited to the SSD. For example, the semiconductor storage device 1 can be configured as a memory card, represented by a Secure Digital (SD) card (registered trademark). When the semiconductor storage device 1 is the memory card, the semiconductor storage device 1 can be applied to various electronic devices, such as a mobile phone, a personal digital assistant (PDA), a digital still camera, and a digital video camera, in addition to the portable computer.

The invention claimed is:

1. A method of controlling a nonvolatile semiconductor memory, the method comprising:
   checking, at a first interval period, an error count of data stored in a first group, the first group including a plurality of blocks;
   when a first block in the first group satisfies a first condition, assigning the first block to a second group;
   checking, at a second interval period, an error count of data stored in the second group, the second interval period being shorter than the first interval period; and
   when a second block in the second group satisfies a second condition, moving data stored in the second block to an erased block in which stored data is erased among the plurality of blocks.

2. The method according to claim 1, wherein each one of the plurality of blocks is a unit of data erasing.

3. The method according to claim 1, wherein the first condition is satisfied when the error count of data stored in a block in the first group exceeds a first threshold value.

4. The method according to claim 3, wherein the second condition is satisfied when the error count of data stored in a block in the second group exceeds a second threshold value.

5. The method according to claim 4, wherein the second threshold value is larger than the first threshold value.

6. The method according to claim 5, wherein the moving further includes:
   copying data stored in the second block to a volatile memory; and
   rewriting the data, which is copied in the volatile memory, into the erased block.

7. The method according to claim 6, wherein the copying further includes correcting errors in the data stored in the second block before copying to the volatile memory.

8. The method according to claim 7, wherein the second threshold value is smaller than an upper limit of correction capability.

9. The method according to claim 1, wherein the second condition is satisfied when the error count of data stored in a block in the second group exceeds a second threshold value.

10. The method according to claim 1, wherein the checking the second group does not include checking a block among the plurality of blocks excluding the first block.

11. The method according to claim 1, wherein the first condition is satisfied when an amount of data read out from a block in the first group exceeds a third threshold value.

12. The method according to claim 1, wherein the first condition is satisfied when an elapsed time from writing data in a block exceeds a fourth threshold value.

13. The method according to claim 12, wherein the checking the first group is executed when reading data in response to a read request supplied from a host apparatus.

14. The method according to claim 13, wherein the checking the second group is executed without receiving any request from a host apparatus.

15. The method according to claim 1, wherein the nonvolatile semiconductor memory includes a plurality of NAND flash memory chips.

16. A method of controlling a nonvolatile semiconductor memory, the method comprising:
- checking, at a first interval period, an error count of data stored in a first group, the first group including a plurality of units;
- when a first unit in the first group satisfies a first condition, assigning the first unit to a second group;
- checking, at a second interval period, an error count of data stored in the second group, the second interval period being shorter than the first interval period; and
- when a second unit in the second group satisfies a second condition, moving data stored in the second unit to an erased unit in which stored data is erased among the plurality of units.

17. The method according to claim 16, wherein each one of the plurality of units is a unit of data erasing.

* * * * *